(12) United States Patent
Leobandung

(10) Patent No.: US 9,257,545 B2
(45) Date of Patent: Feb. 9, 2016

(54) STACKED NANOWIRE DEVICE WITH VARIABLE NUMBER OF NANOWIRE CHANNELS

(71) Applicant: GLOBALFOUNDRIES INC., Grand Cayman (KY)

(72) Inventor: Effendi Leobandung, Stormville, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/024,729

(22) Filed: Sep. 12, 2013

(65) Prior Publication Data

US 2015/0069328 A1   Mar. 12, 2015

(51) Int. Cl.
*H01L 29/775* (2006.01)
*H01L 29/66* (2006.01)

(52) U.S. Cl.
CPC ........ *H01L 29/775* (2013.01); *H01L 29/66439* (2013.01)

(58) Field of Classification Search
CPC ................ B82Y 10/00; H01L 29/0673; H01L 29/78696; H01L 29/66439; H01L 29/775; H01L 29/785
USPC ............. 257/724, 24, 330; 977/762; 438/151, 438/199, 595
See application file for complete search history.

(56) References Cited

U.S. PATENT DOCUMENTS

| | | |
|---|---|---|
| 7,892,945 B2 | 2/2011 | Bedell et al. |
| 8,384,065 B2 | 2/2013 | Bangsaruntip et al. |
| 2010/0295021 A1* | 11/2010 | Chang et al. ..................... 257/24 |
| 2010/0295022 A1* | 11/2010 | Chang et al. ..................... 257/24 |
| 2011/0031473 A1* | 2/2011 | Chang et al. ..................... 257/24 |
| 2014/0175543 A1* | 6/2014 | Glass et al. ................... 257/337 |

FOREIGN PATENT DOCUMENTS

CN    102646624 A    8/2012

OTHER PUBLICATIONS

Sacchetto et al., "Design Aspects of Carry Lookahead Adders with Vertically-Stacked Nanowire Transistors", Proc. IEEE International Symposium on Circuits and Systems. ISCAS 2010, pp. 1715-1718.

(Continued)

*Primary Examiner* — David Vu
*Assistant Examiner* — Jonathan Han
(74) *Attorney, Agent, or Firm* — Scully, Scott, Murphy & Presser, P.C.

(57) ABSTRACT

A method of forming a semiconductor structure including forming a stack of layers on a top surface of a substrate, the stack of layers including alternating layers of a semiconductor material and a sacrificial material, where a bottommost layer of the stack of layers is a top semiconductor layer of the substrate, patterning a plurality of material stacks from the stack of layers, each material stack including an alternating stack of a plurality of nanowire channels and a plurality of sacrificial spacers, the plurality of nanowire channels including the semiconductor material, and the plurality of sacrificial spacers including the sacrificial material, and removing at least one of the plurality of nanowire channels from at least one of the plurality of material stacks without removing one or more of the plurality of nanowire channels from an adjacent material stack.

13 Claims, 45 Drawing Sheets

(56) References Cited

OTHER PUBLICATIONS

Fang et al., "Vertically Stacked SiGe Nanowire Array Channel CMOS Transistors", IEEE Electron Device Letters, vol. 28, No. 3, Mar. 2007, pp. 211-213.

Wang et al., "Fabrication of vertically stacked single-crystalline Si nanowires using self-limiting oxidation", Nanotechnology, vol. 23, (2012), 015307, pp. 1-5.

Dupre et al., "15nm•diameter 3D Stacked Nanowires with Independent Gates Operation: Phi-FET", Proc. Electron Devices Meeting, IEDM 2008, IEEE International.

Buddharaju et al., "Gate-All-Around Si-Nanowire CMOS Inverter Logic Fabricated using Top-down Approach", Proc. of the European Solid-State Device Research Conference, pp. 303-306 (2007).

* cited by examiner

SECTION A-A

SECTION B-B

SECTION A-A

SECTION B-B

SECTION A-A

SECTION B-B

SECTION C-C

SECTION A-A

SECTION B-B

SECTION C-C

SECTION A-A

SECTION B-B

SECTION D-D

SECTION A-A

SECTION B-B

FIG. 25 SECTION D-D

SECTION A-A

FIG. 28 SECTION B-B

SECTION C-C

SECTION D-D

SECTION A-A

SECTION C-C

SECTION D-D

SECTION B-B

FIG. 39 SECTION C-C

SECTION D-D

SECTION B-B

SECTION C-C

SECTION D-D

STACKED NANOWIRE DEVICE WITH VARIABLE NUMBER OF NANOWIRE CHANNELS

BACKGROUND

The present invention generally relates to semiconductor device manufacturing, and more particularly to a stacked nanowire device having a varying number of nanowire channels.

Due to their superior electrostatics gate-all-around nanowire channel field effect transistors (e.g., nanowire FETs) are expected to enable density scaling beyond current planar CMOS technology. In its basic form, a nanowire FET includes a source, a drain and one or more nanowire channels between the source and the drain. A gate electrode, which wraps around the one or more nanowire channels, regulates electron flow through the nanowire channel between the source and drain.

As the diameter of nanowire channel(s) is reduced to enable better electrostatics, the current carrying surface (or area, in the case of bulk inversion) of each nanowire channel is reduced as well, meaning that more nanowire channels need to be placed in closer proximity to each other to achieve the same density of the current carrying surface or area. For example, nanowire channels with a diameter of 4 nm would need to be placed at a pitch of 12 nm to yield the same effective width as a planar device with the same layout footprint. One way to increase layout density in the width direction is to stack the nanowire channels vertically, rather than using just one layer of them. This is a solution that is unique to gate-all-around devices such as nanowire FETs. Nanowire devices having one or more nanowire channels stacked vertically may be referred to as a stacked nanowire device or a stacked nanowire FET.

A stacked nanowire device may be configured with one or more nanowire channels in one or more layers, each layer having the same number of nanowire channels. For example, a stacked nanowire device may have two layers of six nanowire channels, or a total of twelve nanowire channels. In another example, a stacked nanowire device may have four layers of six nanowire channels, and a total of twenty-four nanowire channels. A stacked nanowire device may alternatively be described as having one or more stacks of nanowire channels (hereinafter "nanowire stack"). In the present example, the number of nanowire stacks corresponds to the number of nanowire channels per layer, as described above. Further, the number of nanowire channels per nanowire stack corresponds to the number of layers, as described above.

The current carrying capacity of a nanowire device may be defined and limited by the total number of nanowire channels in a single device. The total number of nanowire channels in a single device is defined by and limited to the number of layers of nanowire channels and the number of nanowire channels in each layer. In order to design nanowire devices with different or varying current carrying capacities, the total number of nanowire channels may be increased or decreased; however, in devices with more than one nanowire channel per layer, the total number of nanowire channels cannot be increased or decreased by a single nanowire channel. Stated differently, in devices with more than one nanowire channel per layer, the total number of nanowire channels can only be increase or decreased by either, the number of layers, or the number of channels in a nanowire layer. For example, the current carrying capacity of a single nanowire device having a total of twelve nanowire channels, two layers of six nanowire channels, may only be increased or decreased by adding or subtracting either two nanowire channels (e.g. one layer) or by six nanowire channels (e.g. one stack).

Considerable design constraints exist with respect to the current carrying capacity of a single stacked nanowire device. Such constraints limit the design flexibility of such devices with respect to their current carrying capacity.

SUMMARY

According to one exemplary embodiment of the present invention, a method is provided. The method may include forming a stack of layers on a top surface of a substrate, the stack of layers including alternating layers of a semiconductor material and a sacrificial material, where a bottommost layer of the stack of layers is a top semiconductor layer of the substrate, patterning a plurality of material stacks from the stack of layers, each material stack including an alternating stack of a plurality of nanowire channels and a plurality of sacrificial spacers, the plurality of nanowire channels including the semiconductor material, and the plurality of sacrificial spacers including the sacrificial material, and removing at least one of the plurality of nanowire channels from at least one of the plurality of material stacks without removing one or more of the plurality of nanowire channels from an adjacent material stack.

According to another exemplary embodiment of the present invention, a method is provided. The method may include forming a stack of layers on a top surface of a substrate, the stack of layers including alternating layers of a semiconductor material and a sacrificial material, where a bottommost layer of the stack of layers is a top semiconductor layer of the substrate, patterning a plurality of material stacks from the stack of layers, each material stack including an alternating stack of a plurality of nanowire channels and a plurality of sacrificial spacers, the plurality of nanowire channels including the semiconductor material, and the plurality of sacrificial spacers including the sacrificial material, and forming a shallow trench isolation regions between the plurality of material stacks such that the plurality of sacrificial spacers remains exposed between the plurality of material stacks. The method may further include removing at least one of the plurality of nanowire channels from at least one of the plurality of material stacks without removing one of the plurality of nanowire channels from an adjacent material stack, forming a dummy gate over a central portion of each of the plurality of material stacks, and forming a pair of sidewall spacers abutting opposite sides of the dummy gate. The method may further include removing a portion of the plurality of sacrificial spacers not covered by the dummy gate to create one or more openings between the plurality of nanowire channels, depositing a dielectric material in the one or more openings between the plurality of nanowire channels, and forming a source region and a drain region each self-aligned to opposite sidewall spacers, the source region and the drain region being in direct contact with opposite end segments of the plurality of nanowire channels. The method may further include removing the dummy gate to form a trench over the central portion of the plurality of material stacks, removing the plurality of sacrificial spacers exposed in the trench selective to the plurality of nanowire channels, and forming a gate electrode within the trench and all around the plurality of nanowire channels.

According to another exemplary embodiment of the present invention, a structure is provided. The structure may include a plurality of vertically stacked and vertically spaced apart nanowire channels located above a substrate, each nanowire channel having two end segments in which one of the end segments is connected to a source region and the other end segment is connected to a drain region, the plurality of vertically stacked and vertically spaced apart nanowire channels are organized in adjacent stacks, and at least one stack of the structure includes a different number of nanowire channels than an adjacent stack, a gate electrode over a central portion of the plurality of vertically stacked and vertically spaced apart nanowire channels, the source region and the drain region is self-aligned with the gate region, and a spacer located between each vertically stacked and vertically spaced apart nanowire channel, the spacer also separating the gate electrode from both the source region and the drain region.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
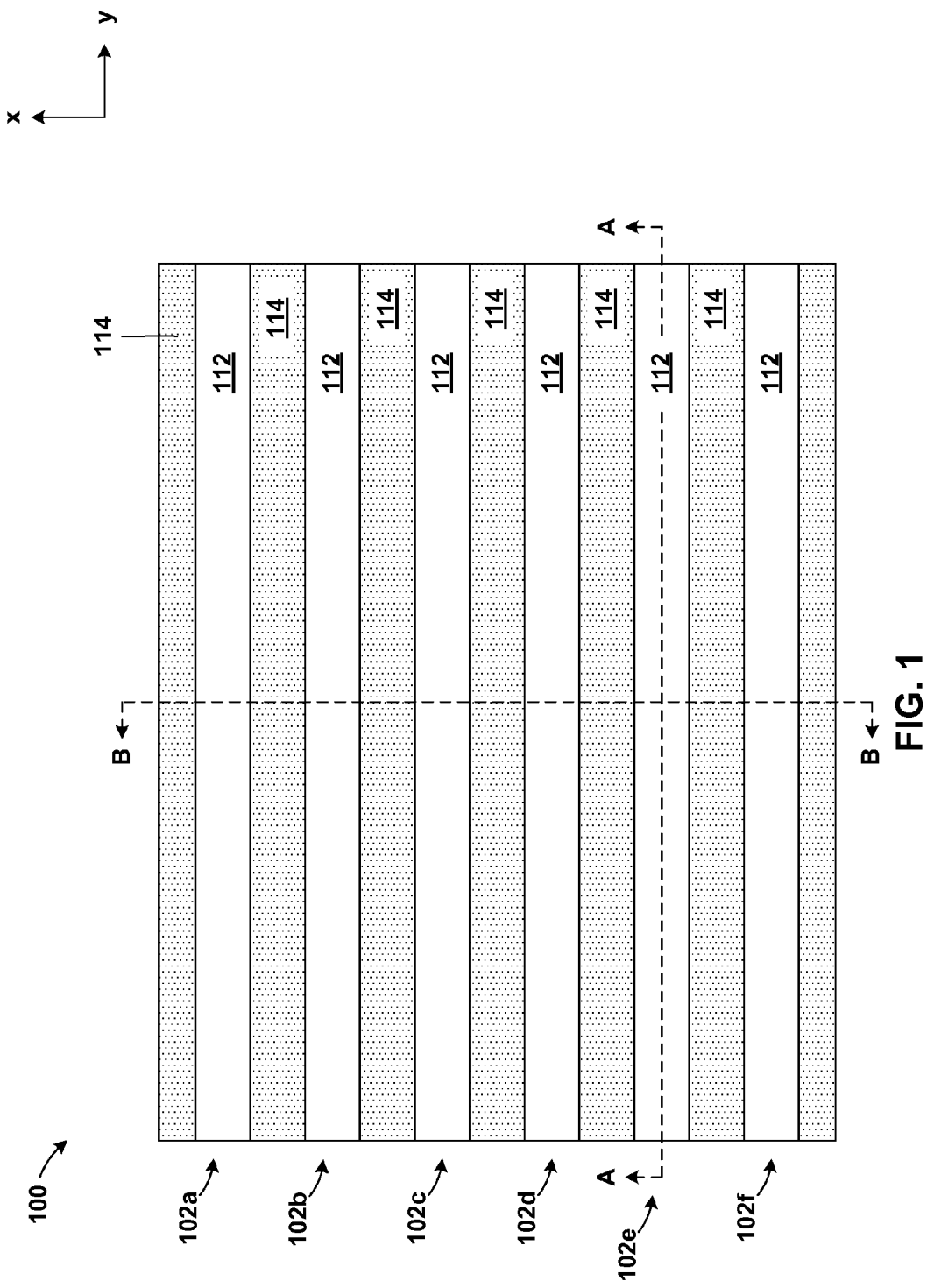
FIG. 1 is a cross-sectional view of a structure at an intermediate step of fabrication according to an exemplary embodiment.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention. Furthermore, it should be noted that while this description may refer to some components of the structure in the singular tense, more than one component may be depicted throughout the figures and like components are labeled with like numerals. The specific number of nanowire stacks depicted in the figures is for illustrative purposes only.

The ability to fabricate a stacked nanowire device having a varying number of nanowire channels per nanowire stack would increase design flexibility. One way to fabricate the stacked nanowire device with varying number of nanowire channels may include patterning one or more nanowire stacks, and selectively removing one or more individual nanowire channels from the one or more nanowire stacks. One embodiment by which to fabricate the stacked nanowire device with varying number of nanowire channels is described in detail below by referring to the accompanying drawings FIGS. 1-45.

Figure 2:
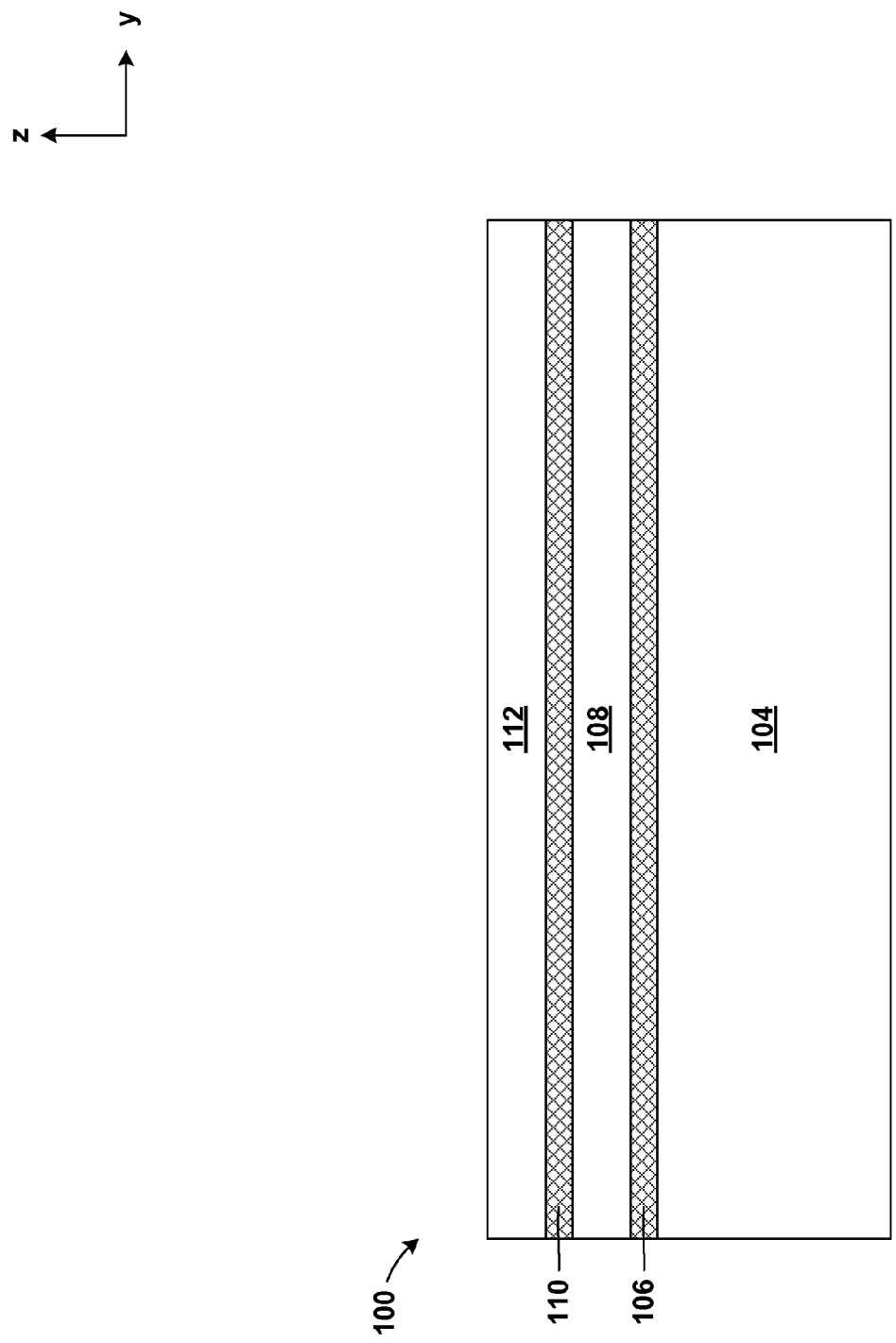
FIG. 2 is a cross section view of FIG. 1, taken along section line A-A.
Figure 3:
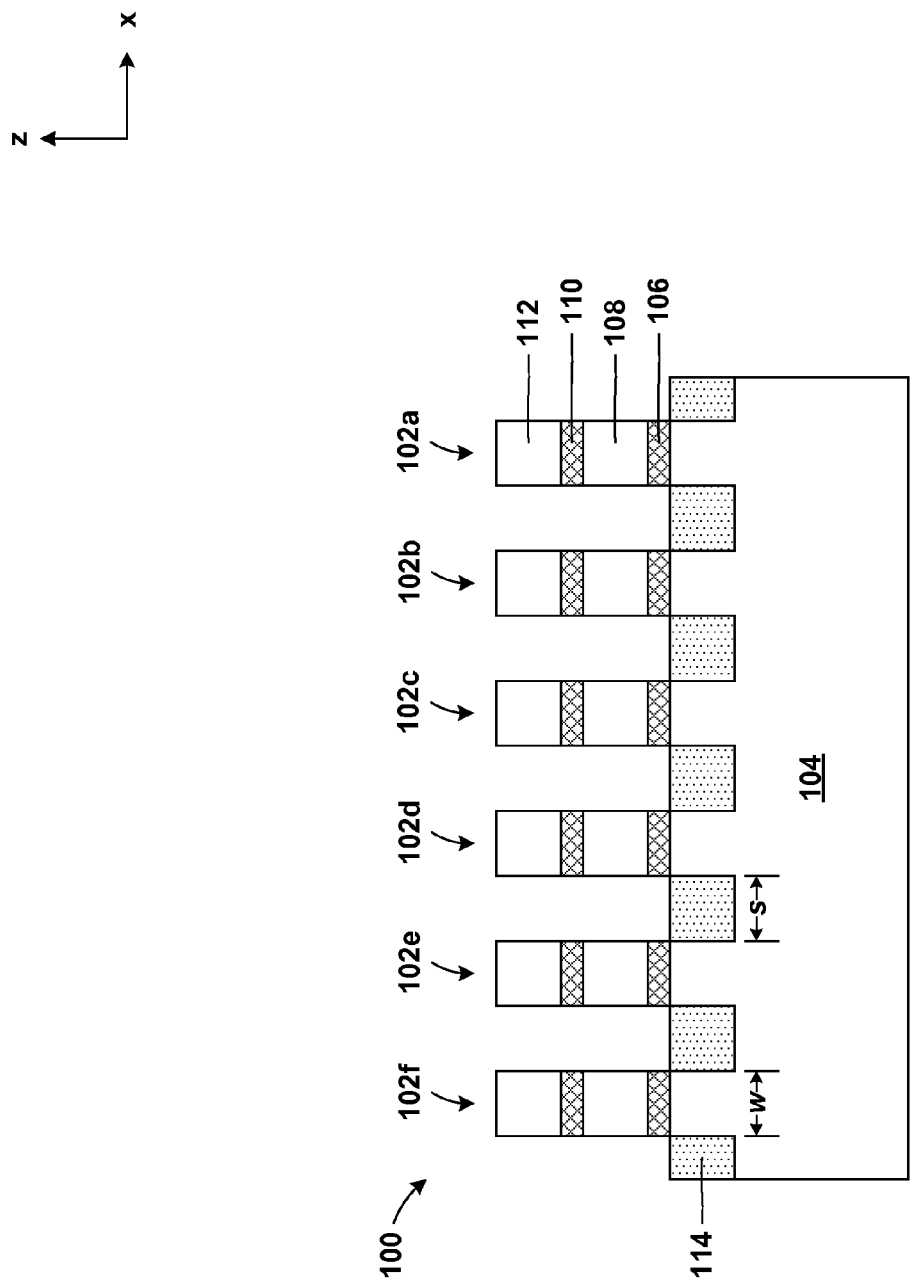
FIG. 3 is a cross section view of FIG. 1, taken along section line B-B.

FIGS. 1, 2, and 3 are a demonstrative illustration of a structure during an intermediate step of a method of fabricating a single stacked nanowire device having a variable number of nanowire channels according to one embodiment. More specifically, the method can begin with patterning one or more stacks of nanowire channels 102a-102f (hereinafter "nanowire stacks") above a substrate 104. FIG. 1 illustrates the structure 100 from a top view. FIG. 2 is a cross section view of FIG. 1 taken along section line A-A. FIG. 3 is a cross section view of FIG. 1 taken along section line B-B. FIG. 2 is a cross sectional view in the center of a single nanowire stack (for example 102e), parallel to the length of the nanowire stacks 102a-102f. FIG. 3 is a cross sectional view perpendicular to the nanowire stacks 102a-102f.

The substrate 104 may include a bulk semiconductor or a layered semiconductor such as Si/SiGe, a silicon-on-insulator (SOI), or a SiGe-on-insulator (SGOI). Bulk semiconductor substrate materials may include undoped Si, n-doped Si, p-doped Si, single crystal Si, polycrystalline Si, amorphous Si, Ge, SiGe, SiC, SiGeC, Ga, GaAs, InAs, InP and all other III/V or II/VI compound semiconductors. In the present embodiment, a bulk substrate may be used. A stack of layers may first be formed above the substrate 104. The stack of layers may include a first semiconductor layer, a first sacrificial layer, a second sacrificial layer, and a second semiconductor layer formed on top of one another and in sequence. In one embodiment, the stack of layers may include any number of semiconductor layers.

The number of semiconductor layers and sacrificial layers that are formed atop the substrate 104 may vary. It should be noted that the number of semiconductor layers may generally correspond with the number of nanowire channels that may be subsequently formed.

The first semiconductor layer and the second semiconductor layer may include any of the semiconducting materials listed above with reference to the substrate 104. In one embodiment, the first semiconductor layer and the second semiconductor layer may be the same material as the substrate 104. The first sacrificial layer and the second sacrificial layer may include any material that which may be easily removed selective to the substrate 104, the first semiconductor layer, and the second semiconducting layer. In one embodiment, the first and second semiconductor layers may include silicon and the first and second sacrificial layers may include silicon-germanium.

Each of the first and second semiconductor layers may be deposited using an epitaxial growth technique. As such, each layer should be single crystalline and have crystalline dimensions close to that of the substrate 104. Also, each of the first and second sacrificial layers may be deposited using an epitaxial growth technique. As such, each layer should also be single crystalline.

The epitaxial growth processes used in forming each semiconductor layer and each sacrificial layer are performed below 800° C., with a temperature of below 650° C. being more preferred. The growth processes can be completed without breaking vacuum between each grown layer, or vacuum can be broken between the growth of each layer to enable extra processing, such as, for example, ex-situ doping of the sacrificial layers for CMOS. Preferably, the vacuum is not broken during the growth of the alternating layers. Notwithstanding whether the vacuum is broken or non-broken during growth of the alternating layers, a purge step is typically performed between each successive layer formation. The growth pressure employed in forming each of alternating layers should be below 100 torr, with a growth pressure below 50 torr being more preferred.

It should be noted that due to the processing steps mentioned above each of the alternating layers may have a height variation that is less than or equal to about 5%. It should be noted that the thickness of each of the first and second sacrificial layers determines the distance that each vertically spaced apart nanowire channel (to be subsequently formed) will be separated by.

After forming the alternating layers of sacrificial material and semiconductor material, a first hard mask may be formed atop the uppermost layer of semiconductor material and the nanowire stacks 102a-102f may be patterned into the substrate 104 and the stack of layers using, for example, known photolithography image transfer techniques. Any other method known in the art can be used to form the nanowire stacks 102a-102f. It should be noted that a portion of the substrate 104 may be removed during patterning of the nanowire stacks 102a-102f, as illustrated in the figures. Stated differently, the nanowire stacks 102a-102f may include a portion of the substrate 104 and a portion of the stack of layers.

After patterning the nanowire stacks 102a-102f from the stack of layers, each individual nanowire stack (102a-102f) may include a portion of the substrate 104, a first sacrificial spacer 106, a first nanowire channel 108, a second sacrificial spacer 110, and a second nanowire channel 112. It should be noted that the first and second sacrificial spacers 106, 110 may be a remaining portion of the first and second sacrificial layers, respectively, and the first and second nanowire channels 108, 112 may be a remaining portion of the first and second semiconductor layers, respectively. Further, the first sacrificial spacer 106 may separate the first nanowire channel 108 from the substrate 104 in each nanowire stack (102a-102f), and the second sacrificial spacer 110 may separate the second nanowire channel 112 from the first nanowire 108 in each nanowire stack (102a-102f).

The nanowire stacks 102a-102f may have a width (w) and be spaced by a distance (s), as shown in the figure. In one embodiment, the width (w) of the nanowire stacks 102a-102f may range from about 8 nm to about 10 nm, and the nanowire stacks 102a-102f may be spaced by a distance (s) ranging from about 30 nm to about 50 nm, as measured from the edge of one nanowire stack to the edge of another nanowire stack. In one embodiment, the first sacrificial spacer 106 and the second sacrificial spacer 110 may have a vertical thickness ranging from about 10 nm to about 20 nm. To minimize parasitic capacitance, the thickness of the first and second sacrificial spacers 106, 110 should be a small as possible while still leaving enough room for two layers of gate dielectric and on layer of gate conductor to fit in the gap formed once the sacrificial spacers 106, 110 are removed in a subsequent processing step. In one embodiment, the first nanowire channel 108 and the second nanowire channel 112 may have a vertical thickness ranging from about 8 nm to about 25 nm.

Therefore, at this stage of fabrication, the structure 100 of the present embodiment may include a single nanowire device having six nanowire stacks (102a-102f), and a total of twelve nanowire channels (108, 112). It should be noted that the number of nanowire channels formed in each nanowire stack (102a-102f) depends on the number of semiconductor layers originally included in the stack of layers. Also, it should be noted that the maximum number of desired nanowires per device should be contemplated and a corresponding number of semiconductor layers should be included in the stack of layers stack.

After the nanowire stacks 102a-102f are patterned a dielectric material may be deposited between the fins 102a-102f to form a shallow trench isolator 114 (hereinafter "STI"). The STI 114 may preferably prevent current leakage through the substrate between adjacent nanowire stacks. The STI 114 may be any thickness such that a top surface of the STI 114 is flush with or below a top surface the substrate 104, as illustrated. The first sacrificial spacer 106 should preferably remain exposed at the sidewalls of the fins 102a-102f.

The STI 114 may be made from any conventional dielectric material including, for example, silicon dioxide. The STI 114 may be formed utilizing known deposition processes. For example, a high-density plasma oxide deposition process or deposition utilizing tetraethylorthosilicate (TEOS) can be employed.

Figure 4:
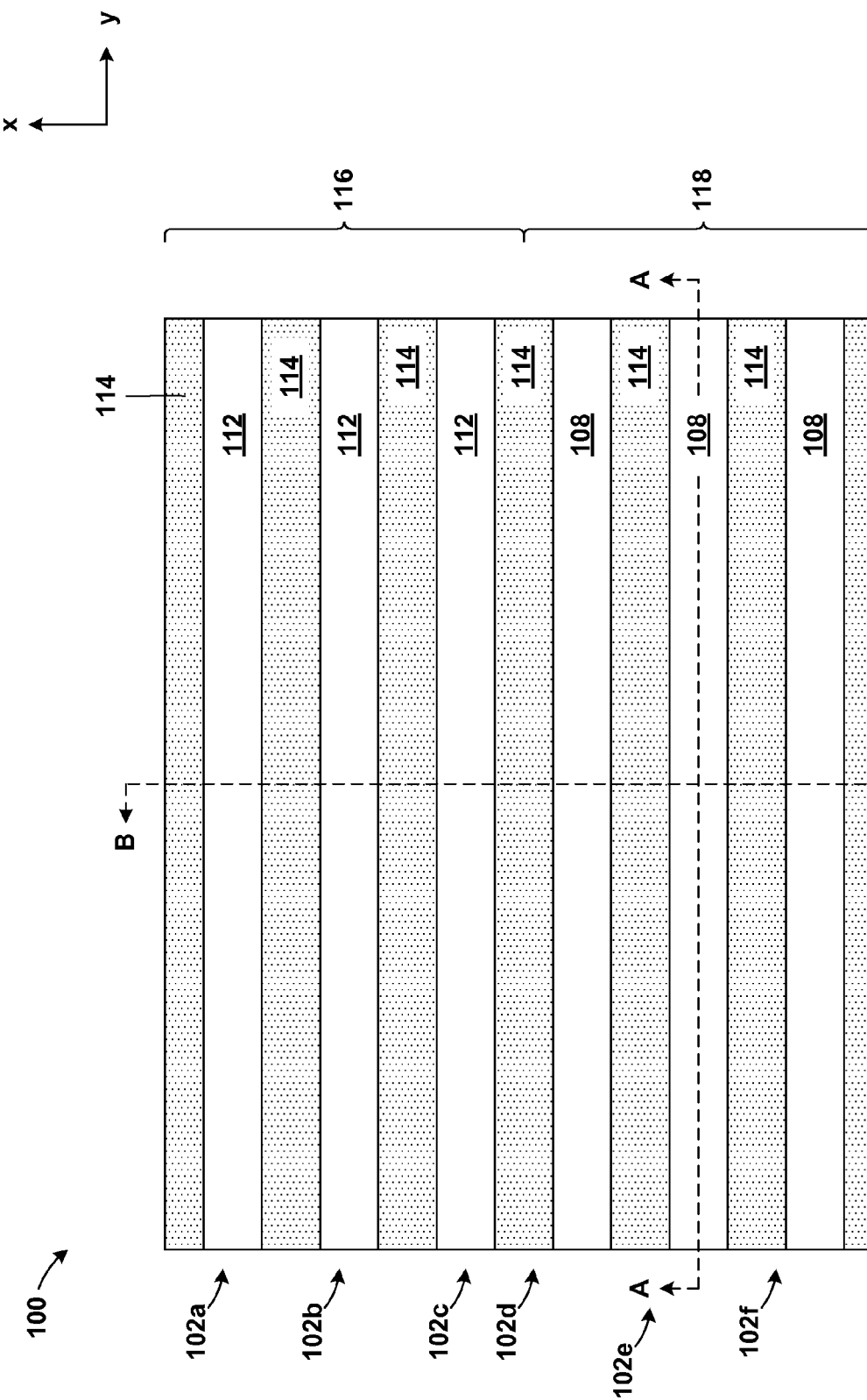
FIG. 4 is a top view of the structure and illustrates selectively removing some of the nano-wires according to an exemplary embodiment.
Figure 5:
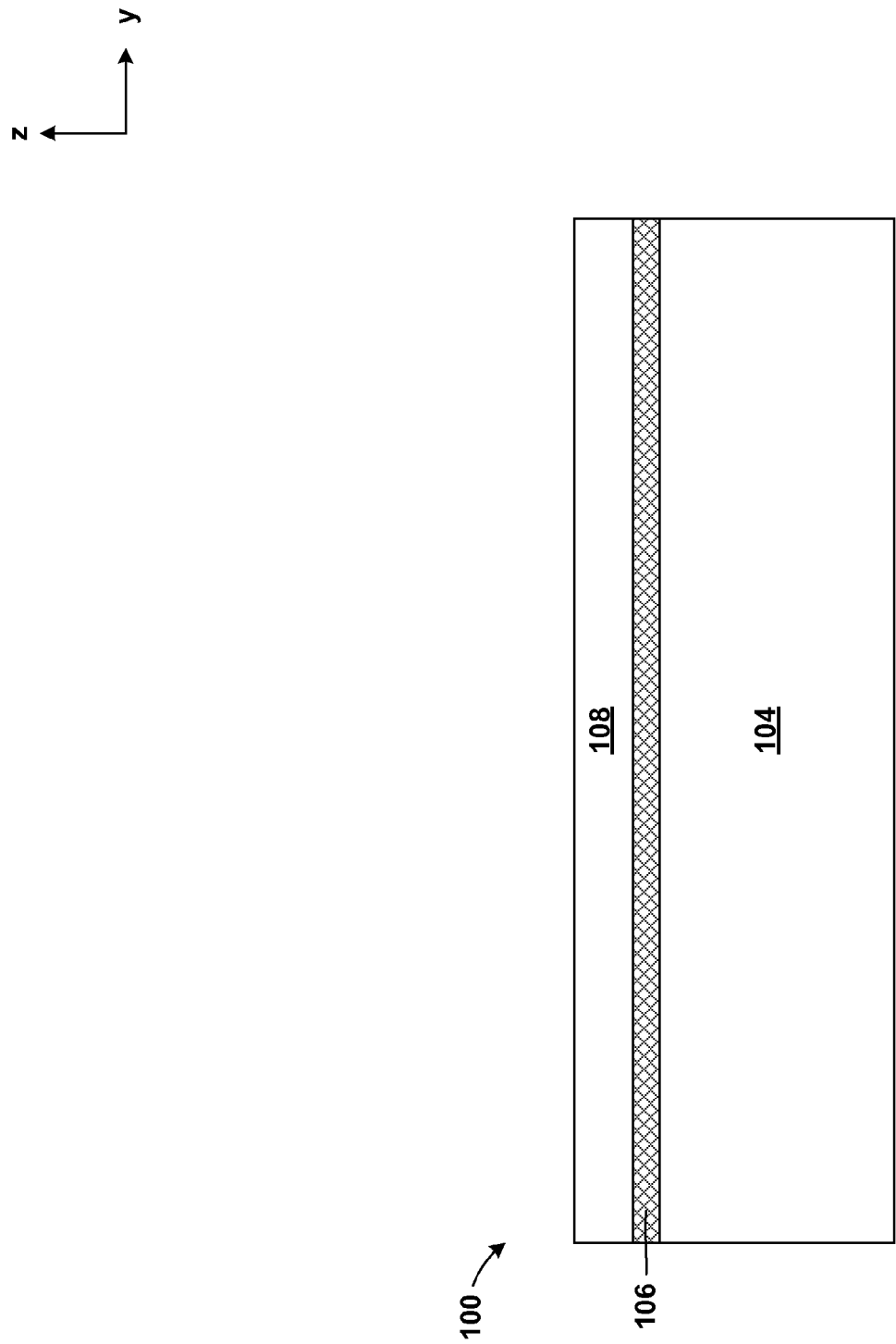
FIG. 5 is a cross section view of FIG. 4, taken along section line A-A.
Figure 6:
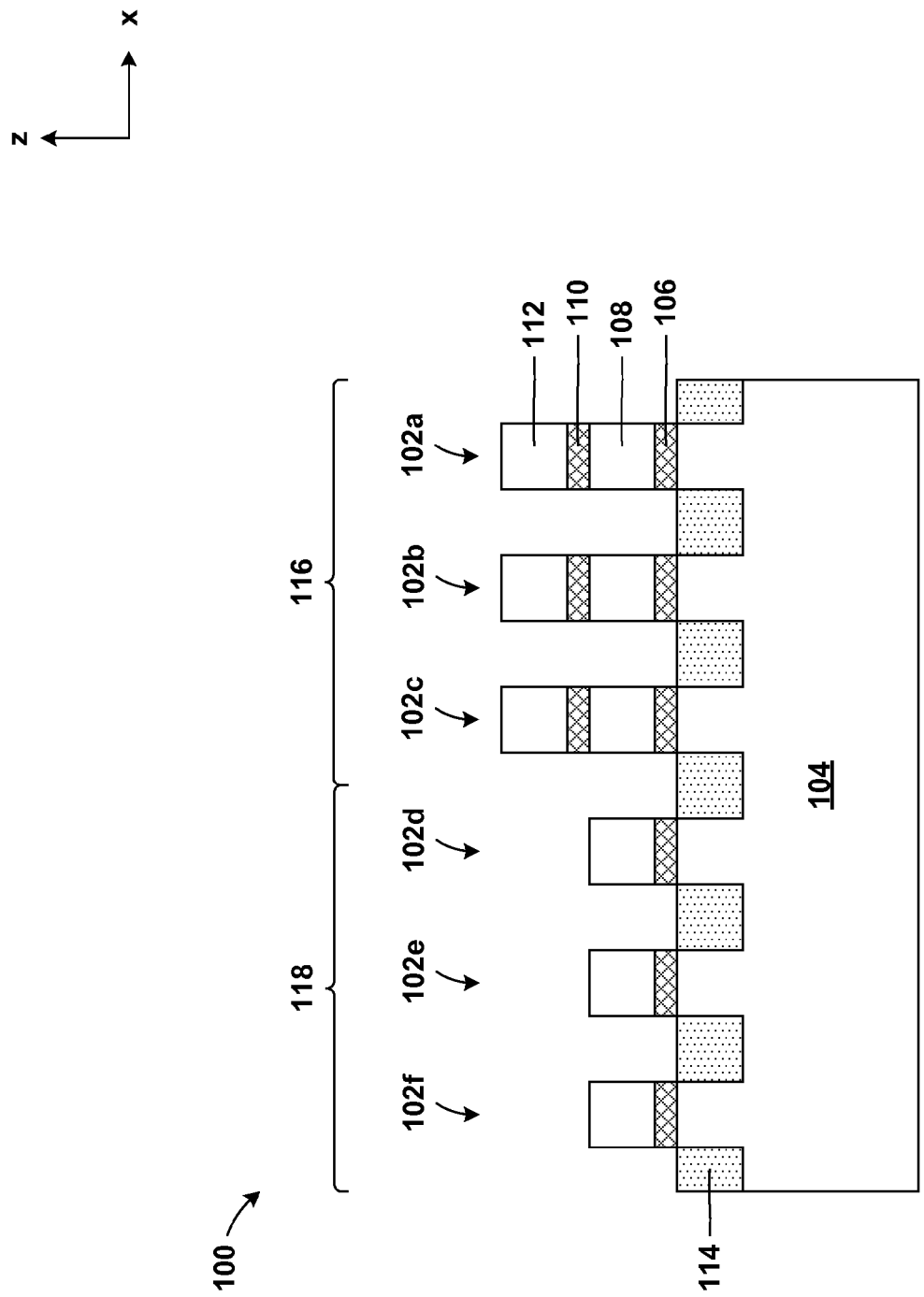
FIG. 6 is a cross section view of FIG. 4, taken along section line B-B.

FIGS. 4, 5, and 6 are a demonstrative illustration of the structure during an intermediate step of the method of fabricating a plurality of finFET devices having a variable number of nano-wires according to one embodiment. More specifically, the method can include selectively removing some of the nanowire channels from some of the nanowire stacks. FIG. 4 illustrates the structure 100 from a top view. FIG. 5 is a cross section view of FIG. 4 taken along section line A-A. FIG. 6 is a cross section view of FIG. 4 taken along section line B-B.

Next, a mask (not shown) may be applied to protect a first region 116 of the structure 100, and one or more nanowire channels (112) may be selectively removed from a second region 118 of the structure 100. In the present embodiment, the second intermediate spacer 110 and the second nanowire channel 112 may be selectively removed from the nanowire stacks 102d-102f in the second region 118 of the structure 100. Therefore, the nanowire stacks 102a-102c may each include two nanowire channels, for example the nanowire channels 108, 112, and the nanowire stacks 102d-102f may each include one nanowire channel, for example the nanowire channel 108. Any masking and etching technique known in the art may be used to selectively remove one or more of the intermediate spacers and one or more of the nanowire channels. In one embodiment, a reactive ion etching technique may be used. In some embodiments, the second intermediate spacer 110 and the second nanowire channel 112 may be removed with a similar removal technique in a single processing chamber, but with different etch chemistries.

Figure 7:
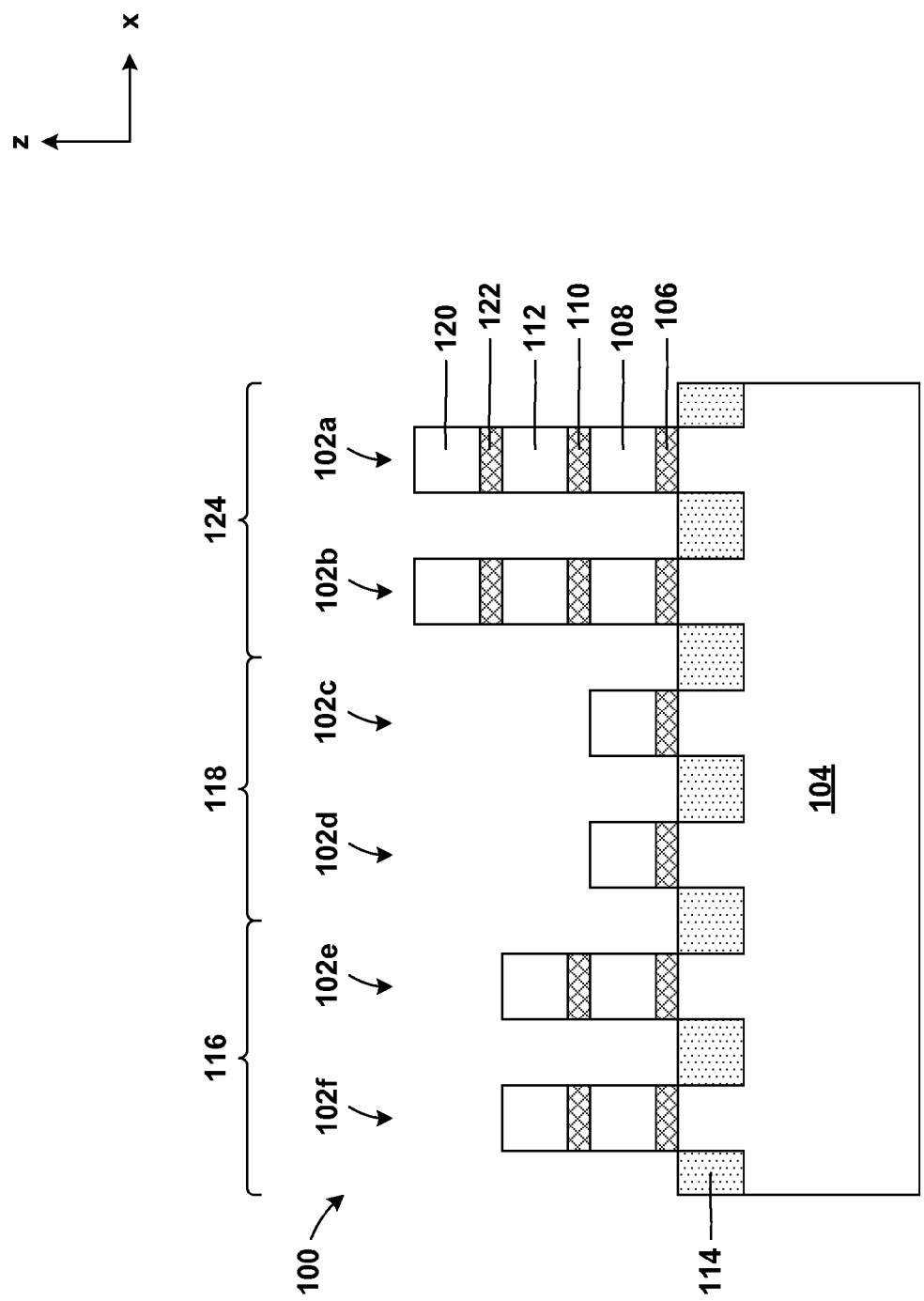
FIG. 7 is a cross section view of FIG. 4, taken along section line B-B, according to an alternative embodiment.

FIG. 7 is a cross section view of FIG. 4 taken along section line B-B, according to an alternative embodiment. More specifically, any number of semiconductor layers may be used to form multiple nanowire stacks each having any number of nanowire channels. In the present embodiment, three semiconductor layers may be used to form three nanowire channels per nanowire stack, for example, the first nanowire channel 108, the second nanowire channel 112, and a third nanowire channel 120. Like above, each nanowire stack (102a-102f) may further include one or more sacrificial spacers, for example the first sacrificial spacer 106, the second sacrificial spacer 110, and a third sacrificial spacer 122. Also like above, the sacrificial spacers (106, 110, 122) may separate each nanowire channel (110, 112, 120) from each other and from the substrate 104.

In the present example, the substrate 104 may have three designated regions, for example, a first region 116, a second region 118, and a third region 124. The techniques described above with reference to FIG. 4 may be used to selectively remove the third nanowire channel 120 and the third sacrificial spacer 122 from the first region 116, and to selectively remove the third nanowire channel 120, the third sacrificial spacer 122, the second nanowire channel 112, and the second sacrificial spacer 110 from the second region 118. Therefore, the nanowire stacks 102a-102b may be each include three nanowire channels, for example the nanowire channels 108, 112, 120, the nanowire stacks 102c-102d may each include one nanowire channel, for example the nanowire channel 108, and the nanowire stack 102e-102f may each include two nanowire channels, for example the nanowire channels 108, 112.

Figure 8:
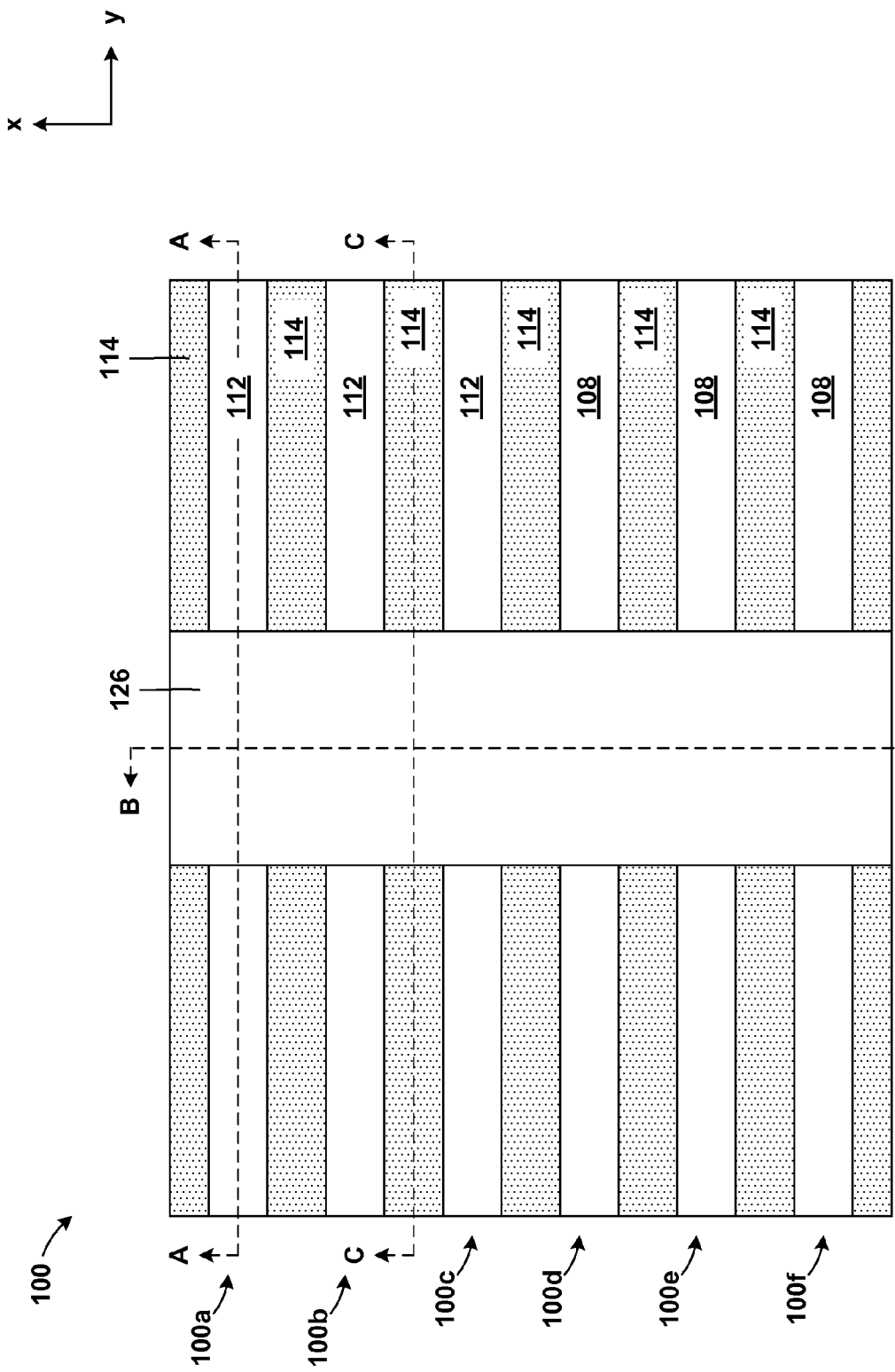
FIG. 8 is a top view of the structure and illustrates forming a dummy gate according to an exemplary embodiment.
Figure 9:
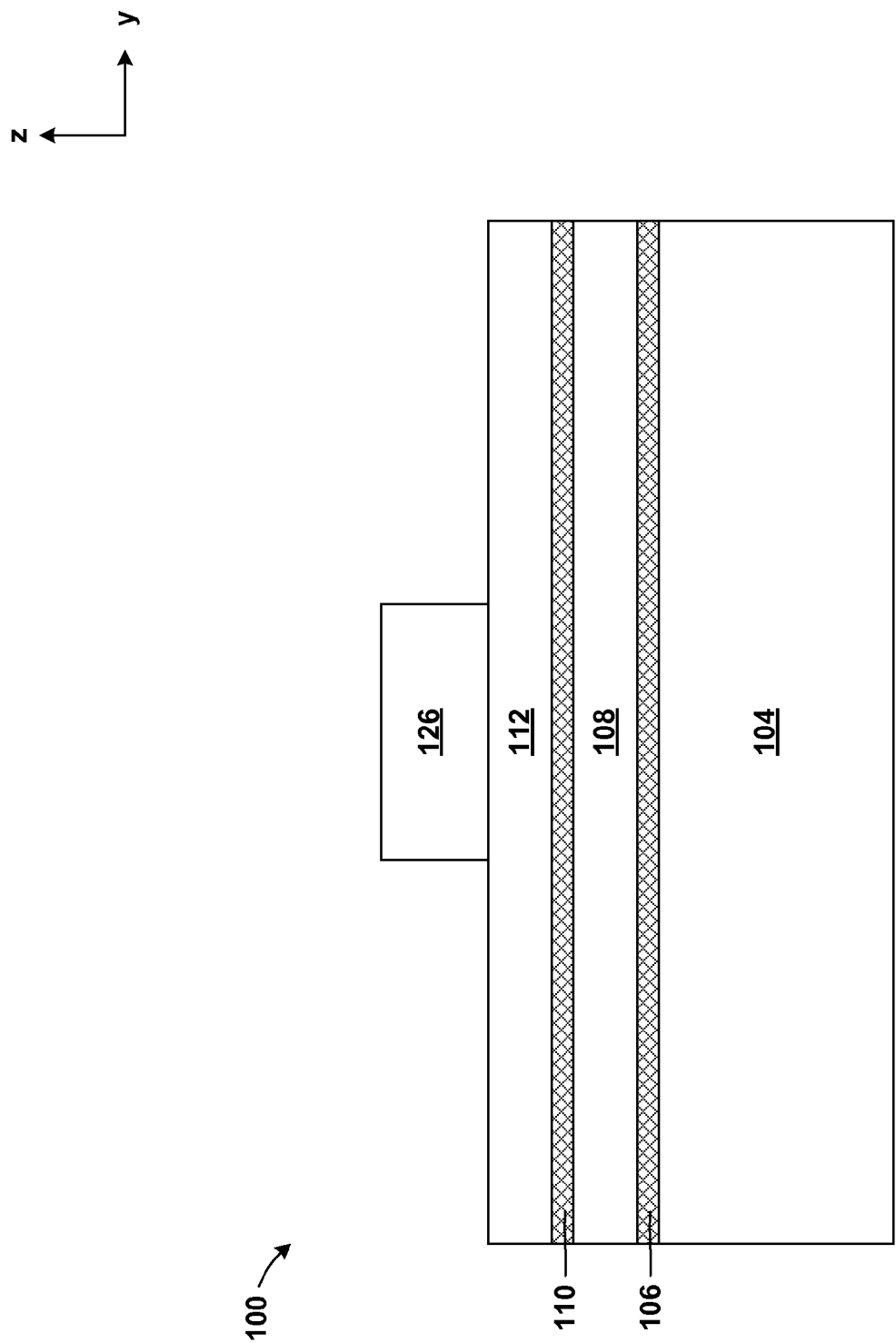
FIG. 9 is a cross section view of FIG. 8, taken along section line A-A.
Figure 10:
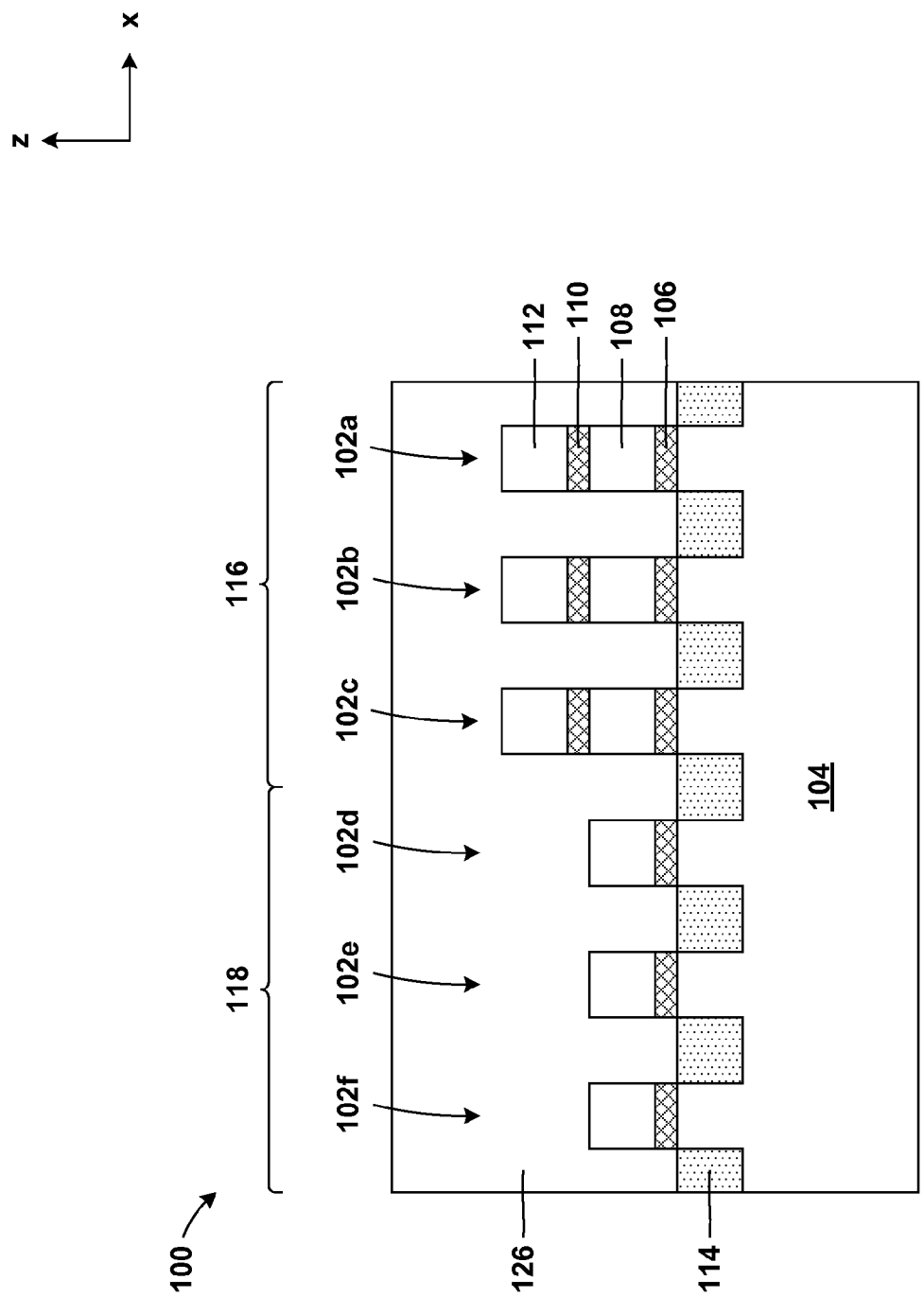
FIG. 10 is a cross section view of FIG. 8, taken along section line B-B.
Figure 11:
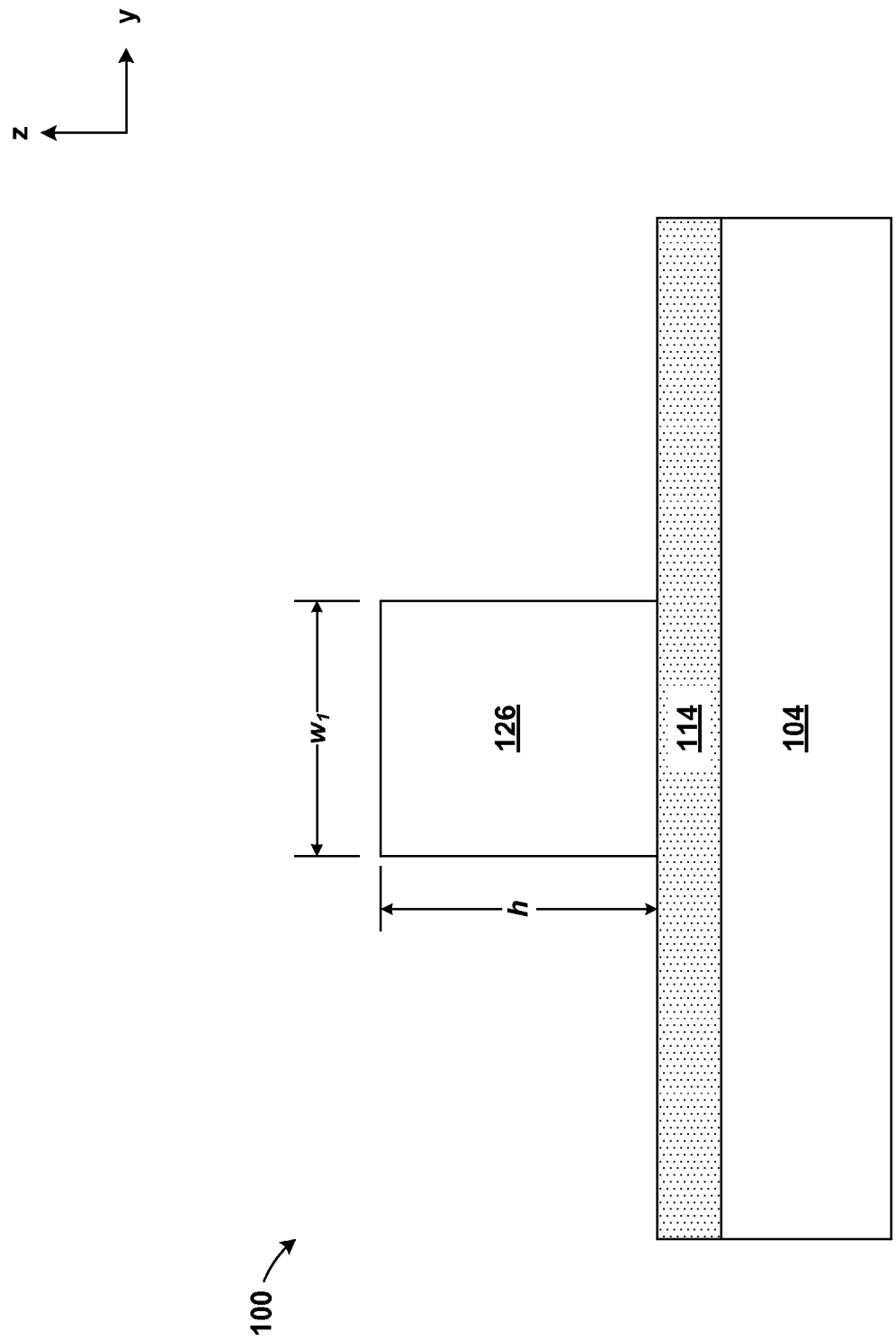
FIG. 11 is a cross section view of FIG. 8, taken along section line C-C.

FIGS. 8, 9, 10, and 11 are a demonstrative illustration of the structure during an intermediate step of the method of fabricating a plurality of finFET devices having a variable number of nano-wires according to one embodiment. More specifically, the method can include forming a dummy gate 126 above a center portion of the nanowire stacks 102a-102f. FIG. 8 illustrates the structure 100 from a top view. FIG. 9 is a cross section view of FIG. 8 taken along section line A-A. FIG. 10 is a cross section view of FIG. 8 taken along section line B-B. FIG. 11 is a cross section view of FIG. 10 taken along section line C-C.

A sacrificial layer may first be deposited above the structure 100. The sacrificial layer may include any suitable silicon or polysilicon able to be selectively removed. In one embodiment, the sacrificial layer may include amorphous silicon. The sacrificial layer may be deposited using typical deposition techniques, for example, atomic layer deposition (ALD), molecular layer deposition (MLD), chemical vapor deposition (CVD), physical vapor deposition (PVD), and spin on techniques. In one embodiment, the sacrificial layer may have a vertical thickness, or height, above the STI 114 ranging from about 80 nm to about 150 nm, and ranges there between. It should be noted that the vertical thickness of the sacrificial layer may correspond to the height of the dummy gate 126, which may be subsequently patterned form the sacrificial layer. In some embodiments, a thin layer of dummy oxide (not shown) may be deposited prior to depositing the sacrificial layer.

In one embodiment, a cap layer (not shown) may alternatively be fabricated atop the sacrificial layer. The cap layer may include any suitable dielectric material known in the art, for example, a nitride. The cap layer may also be deposited using typical deposition techniques, for example, atomic layer deposition (ALD), molecular layer deposition (MLD), chemical vapor deposition (CVD), physical vapor deposition (PVD), and spin on techniques. In one embodiment, the cap layer may include silicon nitride ($Si_3N_4$) deposited using a chemical vapor deposition technique. In one embodiment, the cap layer may have a thickness ranging from about 10 nm to about 50 nm and ranges there between, although a thickness less than 10 nm and greater than 50 nm may be acceptable.

The dummy gate 126 may then be patterned from the sacrificial layer by any suitable lithography technique known in the art. In one embodiment, the dummy gate 126 may have a width ($w_1$) and a height (h). The width ($w_1$) may range from about 20 nm to about 200 nm, although lesser or greater values may be acceptable. As previously described, the height (h) may correspond to the thickness of the sacrificial layer. It should be noted that the sacrificial layer, and now the dummy gate 126 covers all three sides of the nanowire stacks 102a-102f. It should also be noted that the area of the structure 100 covered by the dummy gate 126 may generally be referred to as a gate region, and the areas of the structure 100 not covered by the dummy gate 126 may generally be referred to as a source-drain region.

The location of the dummy gate 126, which is orthogonal to the underlying patterned nanowire stacks 102a-102f, further defines the location of the nanowire channels in the y-direction as well as the location of the gate.

Figure 12:
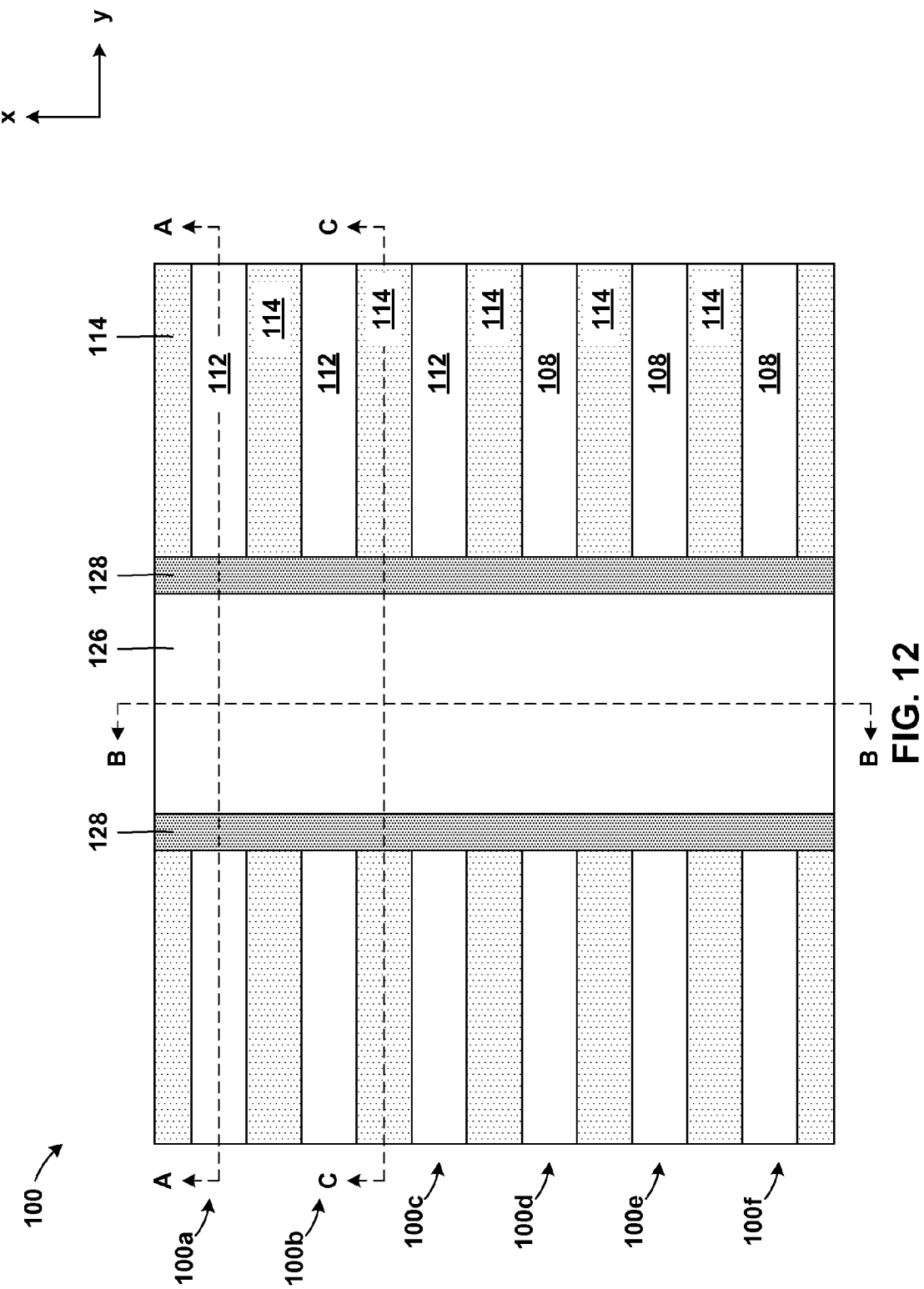
FIG. 12 is a top view of the structure and illustrates forming a pair of sidewall spacers according to an exemplary embodiment.
Figure 13:
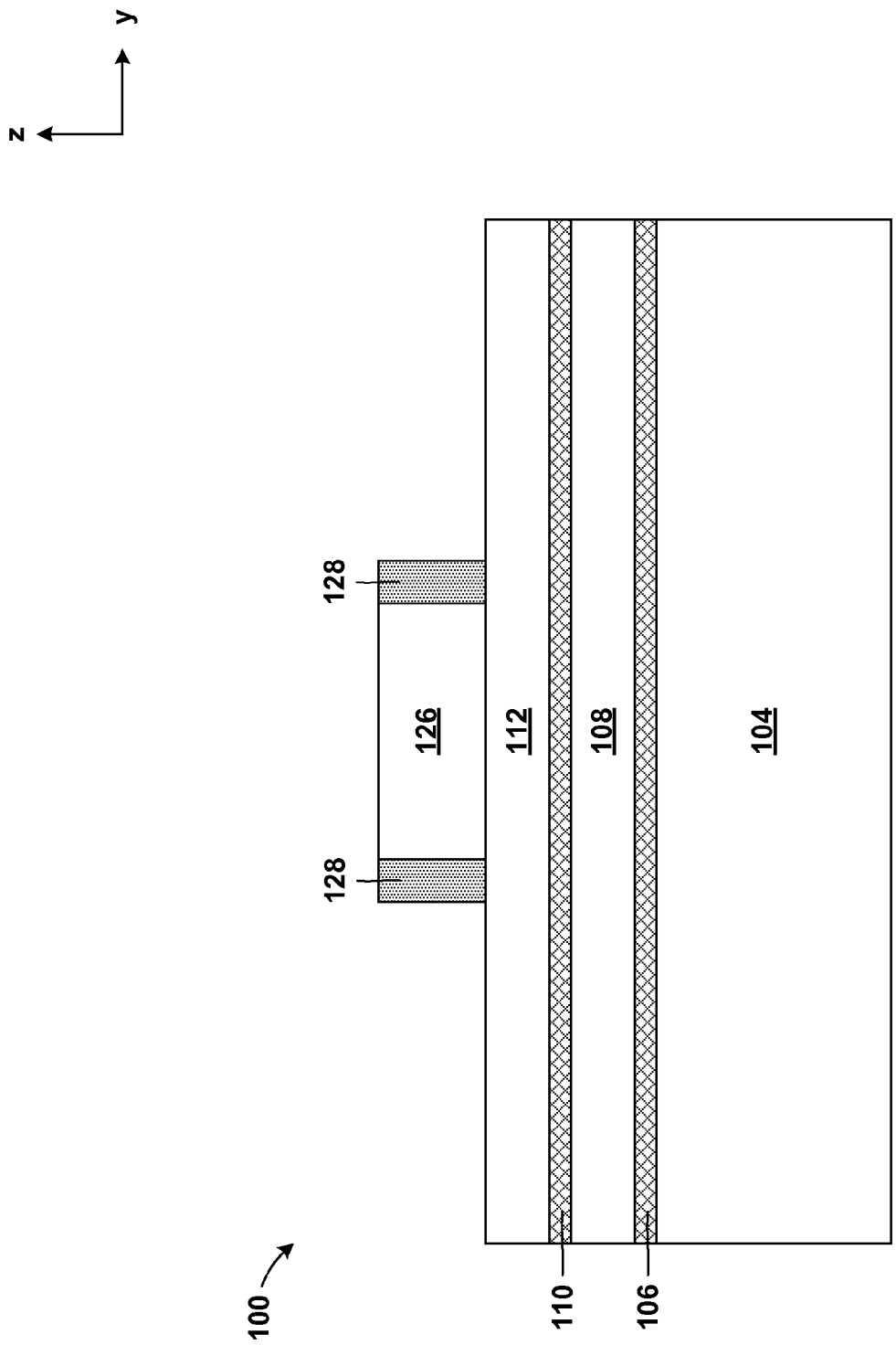
FIG. 13 is a cross section view of FIG. 12, taken along section line A-A.
Figure 14:
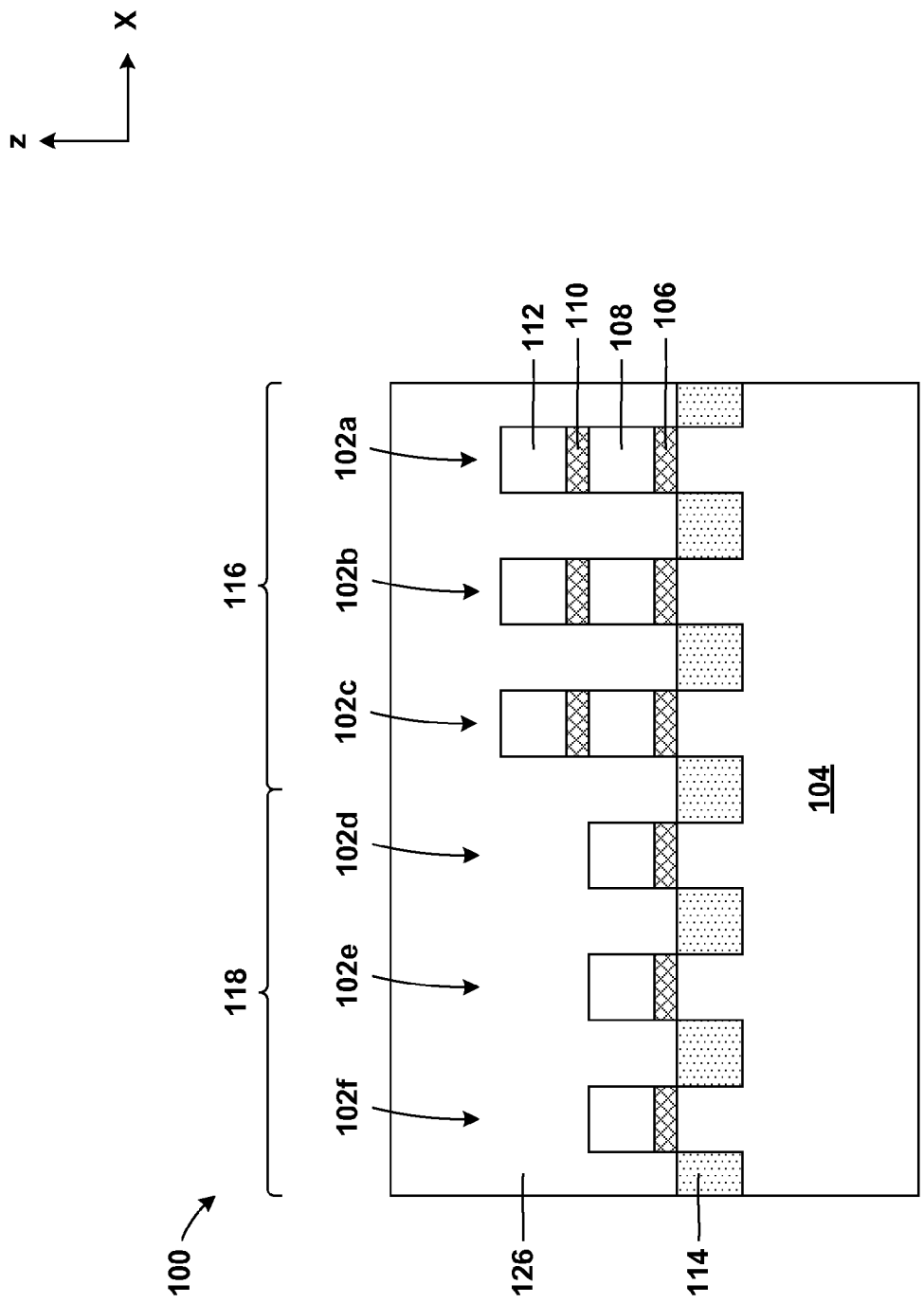
FIG. 14 is a cross section view of FIG. 12, taken along section line B-B.
Figure 15:
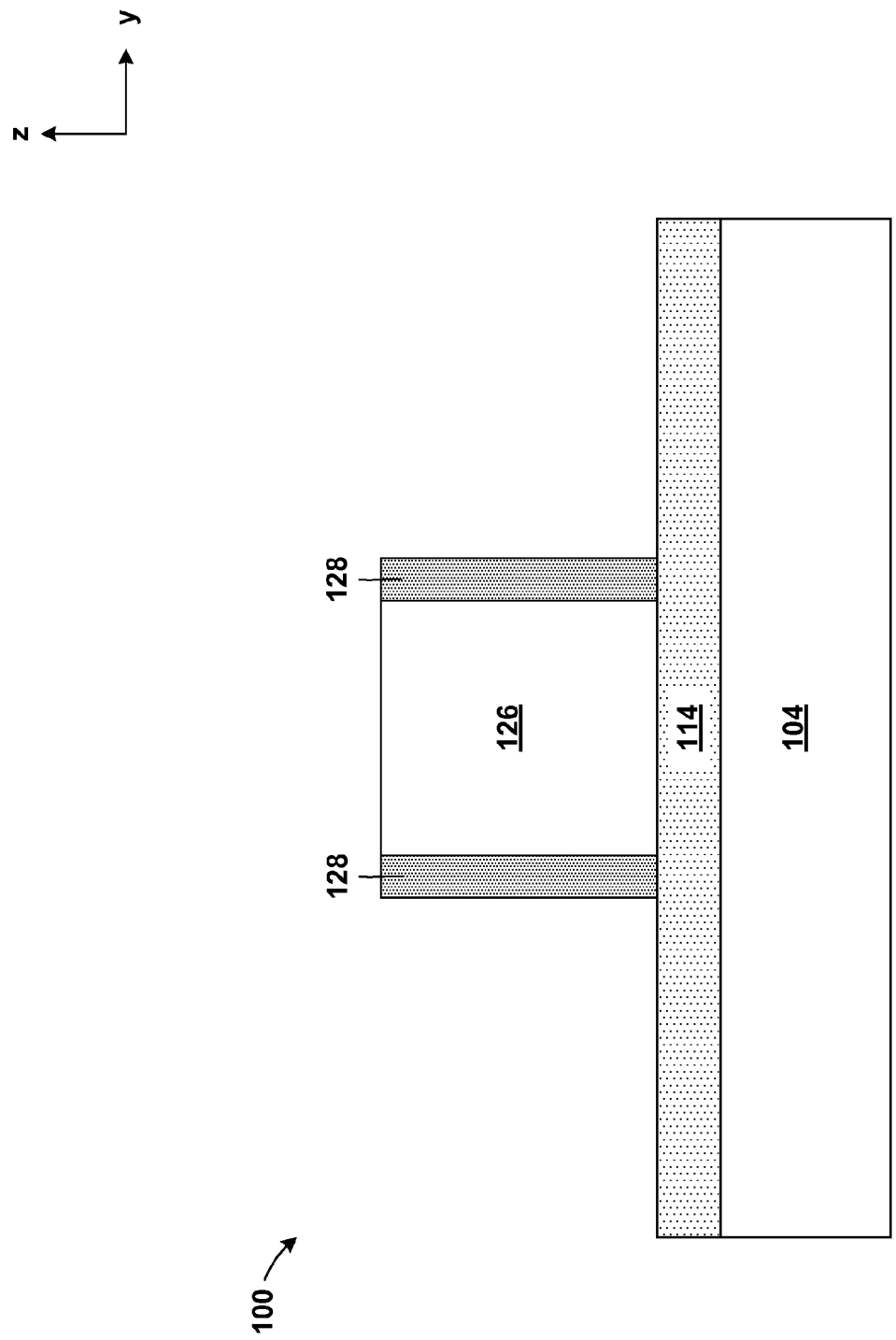
FIG. 15 is a cross section view of FIG. 12, taken along section line C-C.

FIGS. 12, 13, 14, and 15 are a demonstrative illustration of the structure during an intermediate step of a method of fabricating a plurality of finFET devices having a variable number of nano-wires according to one embodiment. More specifically, the method can include forming one or more sidewall spacers 128 (hereinafter "sidewall spacers") on a sidewall of the dummy gate 126. FIG. 12 illustrates the structure 100 from a top view. FIG. 13 is a cross section view of FIG. 12 taken along section line A-A. FIG. 14 is a cross section view of FIG. 12 taken along section line B-B. FIG. 15 is a cross section view of FIG. 12 taken along section line C-C.

The sidewall spacers 128 may be formed by conformally depositing or growing a blanket dielectric material, followed by an anisotropic etch that removes the dielectric from the horizontal surfaces of the structure 100 as well as the sidewalls of the nanowire stacks 102a-102f while leaving it on the sidewalls of the dummy gate 126. In one embodiment, the sidewall spacers 128 may include any suitable dielectric. In one embodiment, the sidewall spacers 128 may include a nitride, an oxynitride, or an oxide. In one embodiment, the sidewall spacers 128 may have a horizontal width, or thickness, ranging from about 3 nm to about 30 nm, with 5 nm being most typical. In one embodiment, the sidewall spacers 128 may include a similar material as the cap layer above. Typically, the sidewall spacers 128 may include a single layer; however, the sidewall spacers 128 may include multiple layers of dielectric material. It may be noted that the sidewall spacers 128 may generally insulate the gate regions from the source-drain regions. It should be noted that the blanket dielectric layer may preferably be completely removed from above the nanowire stacks 102a-102f, in the source-drain regions. The sidewall spacers 128 reduce parasitic capacitance between the gate and the subsequently formed source-drain regions.

Figure 16:
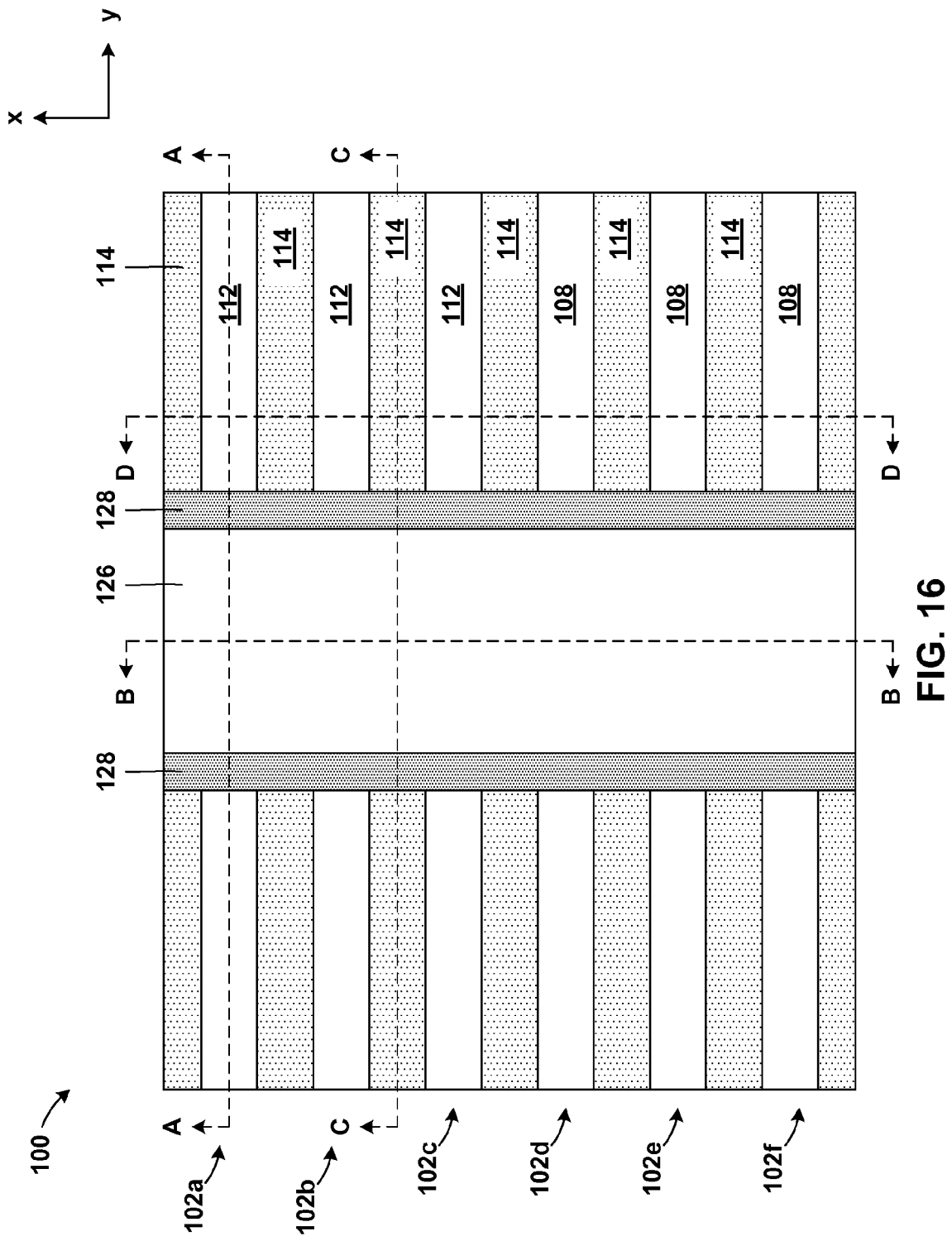
FIG. 16 is a top view of the structure and illustrates the selective removal of a portion of a first sacrificial layer and a portion of a second sacrificial layer according to an exemplary embodiment.
Figure 17:
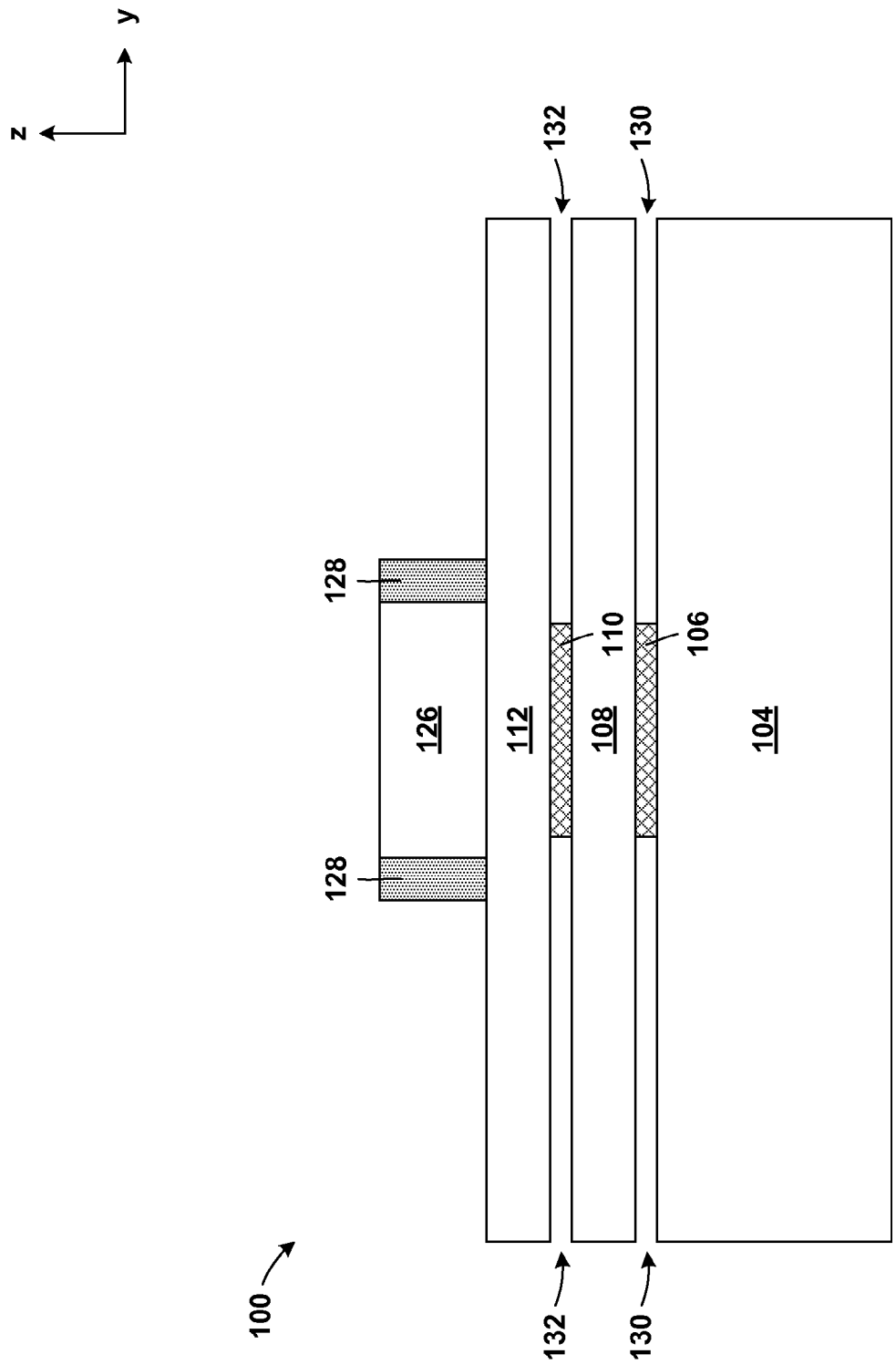
FIG. 17 is a cross section view of FIG. 16, taken along section line A-A.
Figure 18:
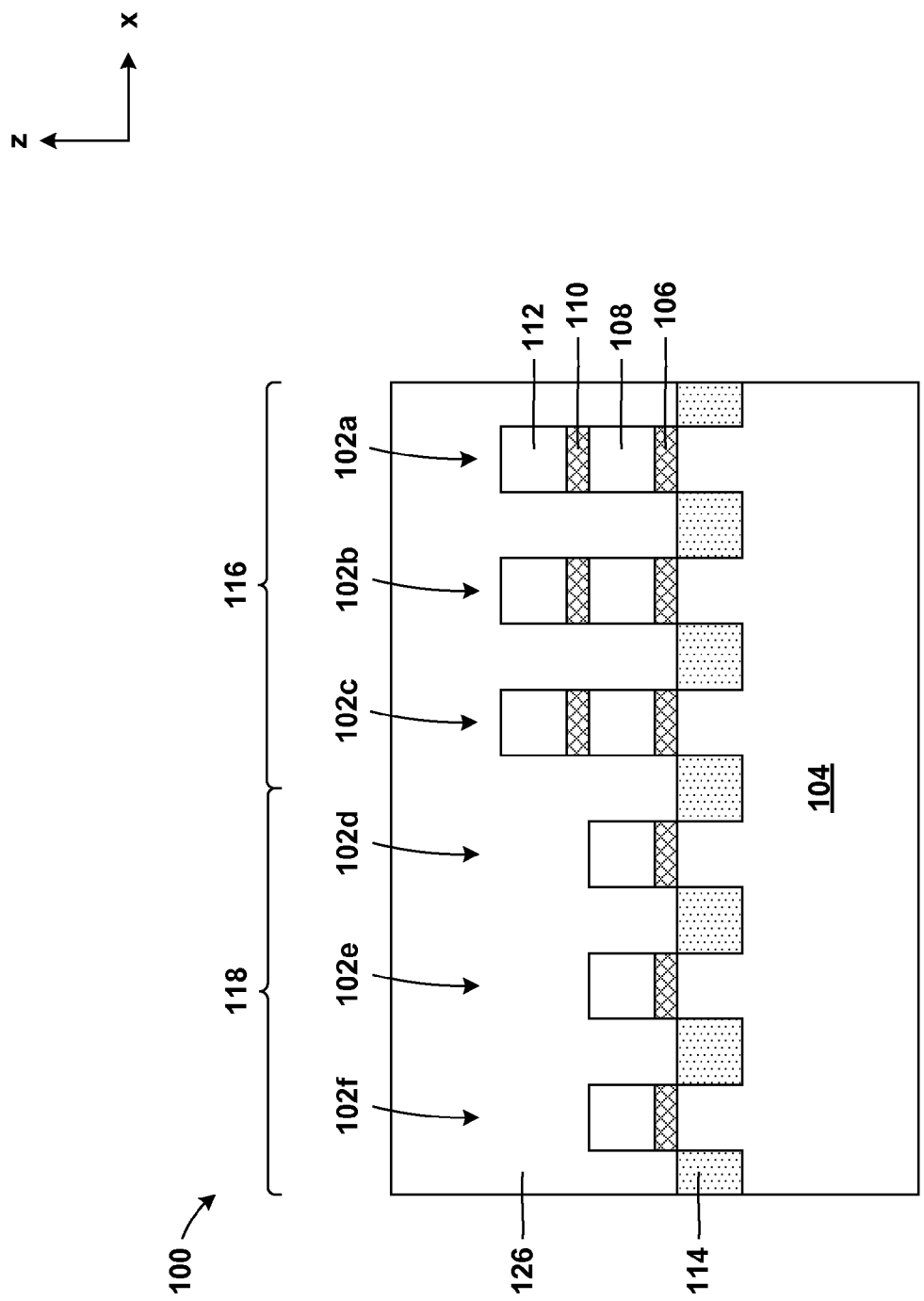
FIG. 18 is a cross section view of FIG. 16, taken along section line B-B.
Figure 19:
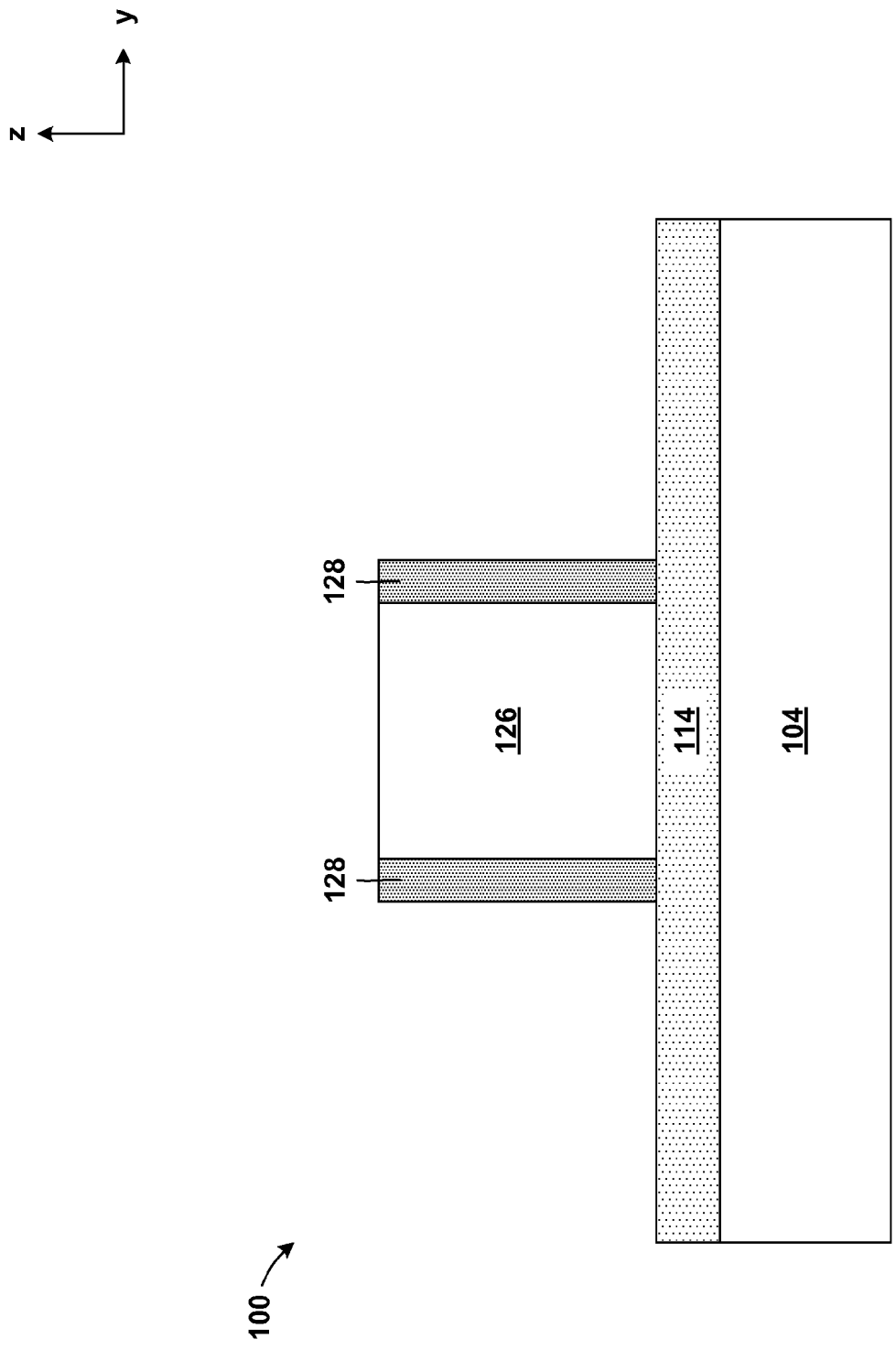
FIG. 19 is a cross section view of FIG. 16, taken along section line C-C.
Figure 20:
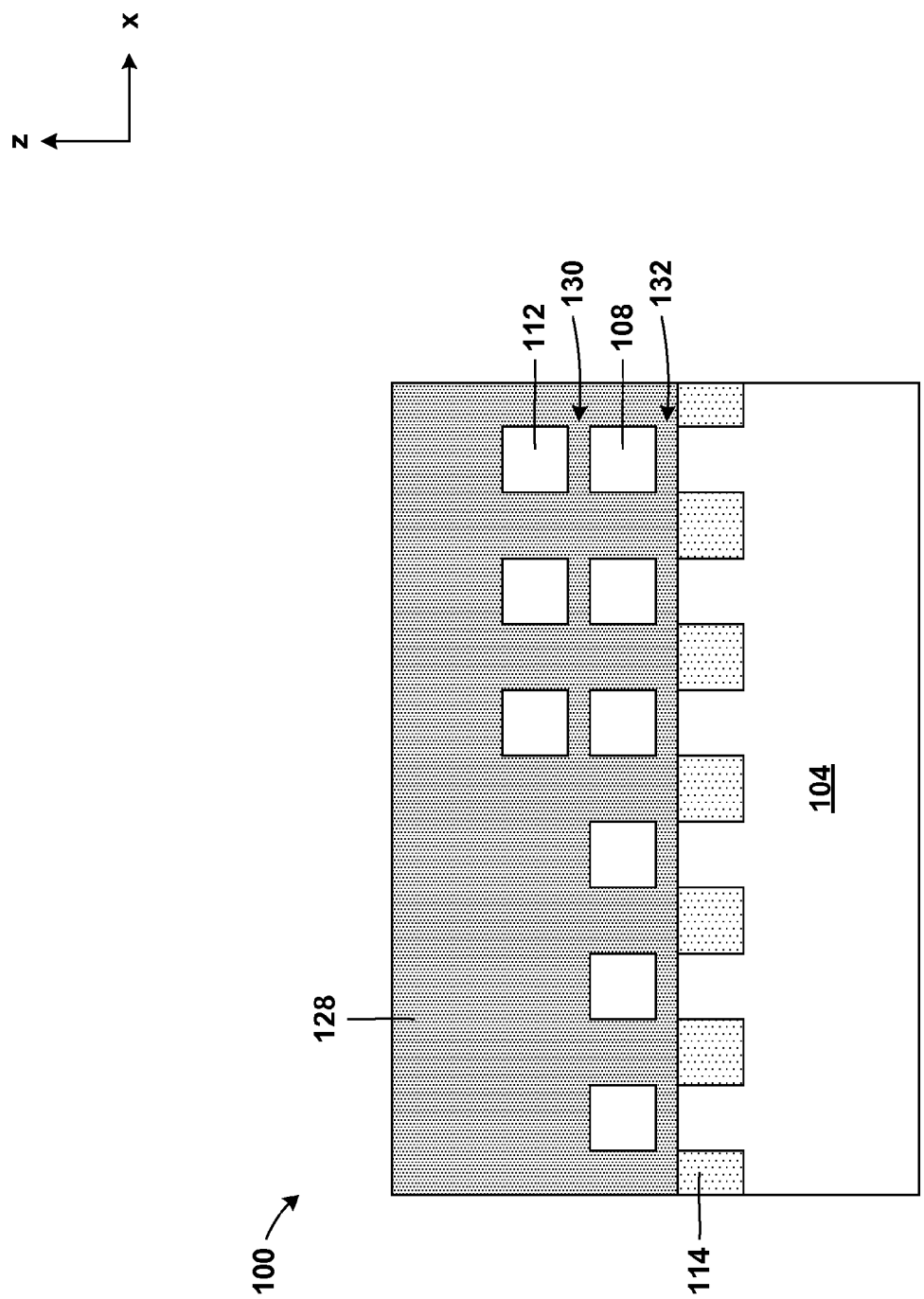
FIG. 20 is a cross section view of FIG. 16, taken along section line D-D.

FIGS. 16, 17, 18, 19, and 20 a demonstrative illustration of the structure during an intermediate step of a method of fabricating a plurality of finFET devices having a variable number of nano-wires according to one embodiment. More specifically, the method can include removing a first portion of the first and second sacrificial spacers 106, 110. FIG. 16 illustrates the structure 100 from a top view. FIG. 17 is a cross section view of FIG. 16 taken along section line A-A. FIG. 18 is a cross section view of FIG. 16 taken along section line B-B. FIG. 19 is a cross section view of FIG. 16 taken along section line C-C. FIG. 20 is a cross section view of FIG. 16 taken along section line D-D.

A first portion of the first and second sacrificial spacers 106, 110 exposed between the nanowire stacks 102a-102f may be removed to create a first opening 130 and a second opening 132. The first portion of the first and second sacrificial spacers 106, 110 may be removed selective to the substrate 104 and the first and second nanowire channels 108, 112. Generally, the first portion of the first and second sacrificial spacers 106, 110 may include any portion not covered by the dummy gate 126.

In one embodiment, an isotropic wet etch may be used to selectively remove the first portion of the first and second sacrificial spacers 106, 110. In one embodiment, the first portion of the first and second sacrificial spacers 106, 110 may be selectively removed by chemically utilizing an etchant that exploits the lower oxidation potential of the sacrificial layers compared to the semiconductor layers. Examples of such etchants include, but are not limited to, a 1:2:3 mixture of $HF:H_2O_2:CH_3COOH$, or a mixture of $H_2SO_4$ and $H_2O_2$. In one embodiment, the selective removal of the first portion of the first and second sacrificial spacers 106, 110 can be achieved using a dry etching process such as $O_2$ plasma etching or plasma chemistries typically used for etching.

After removal of the first portion of the first and second sacrificial spacers 106, 110, the first and second openings 130, 132 may extend beneath the pair of sidewall spacers 128 due to some undercutting during the removal process. In one embodiment, the first and second openings 130, 132 (i.e. the undercut) may extend beneath the dummy gate 126, as illustrated. Further, a second portion of the first and second sacrificial layers may remain beneath the dummy gate 126 or in the gate region of the structure 100.

Figure 21:
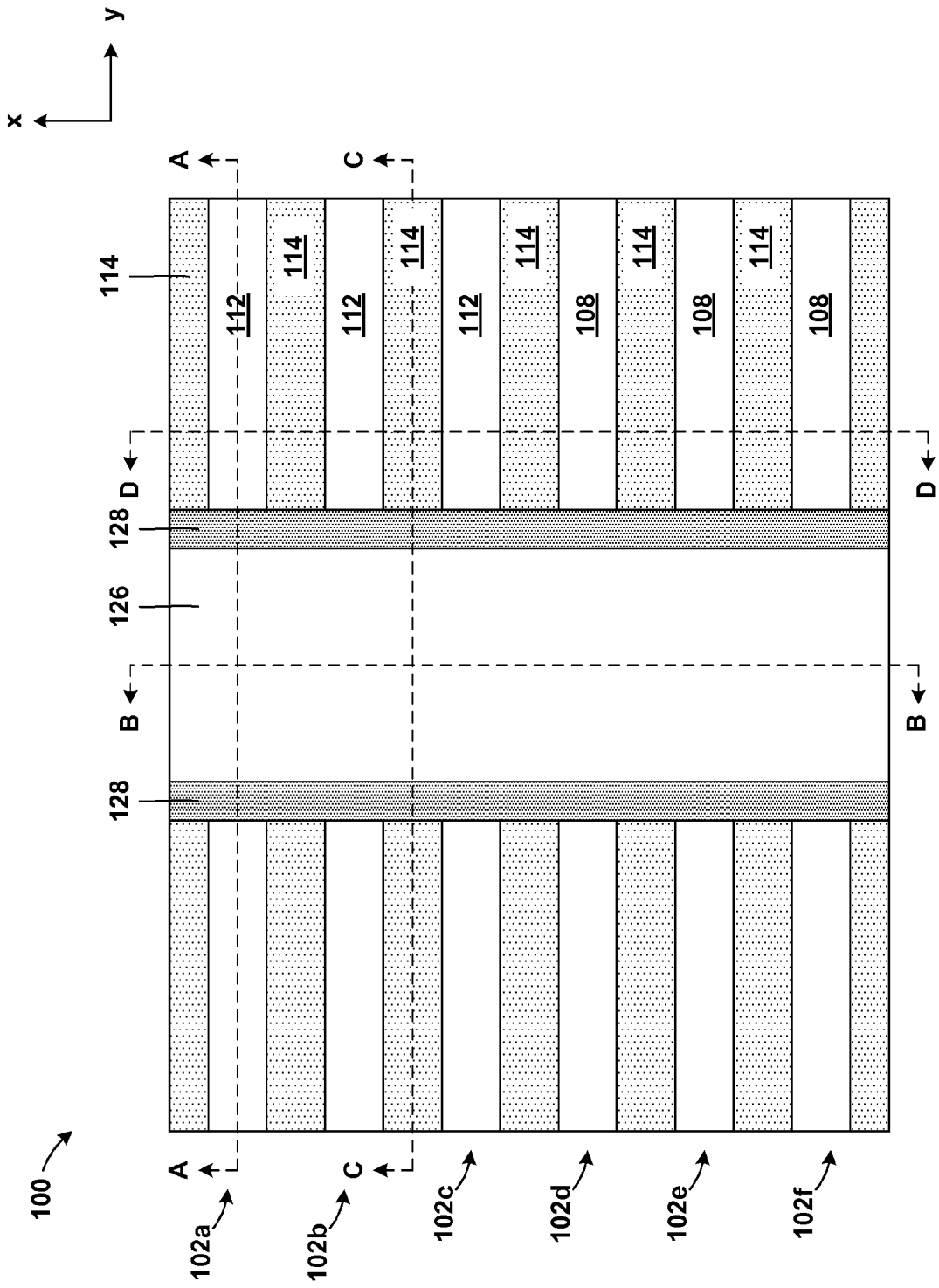
FIG. 21 is a top view of the structure and illustrates the deposition of a dielectric material according to an exemplary embodiment.
Figure 22:
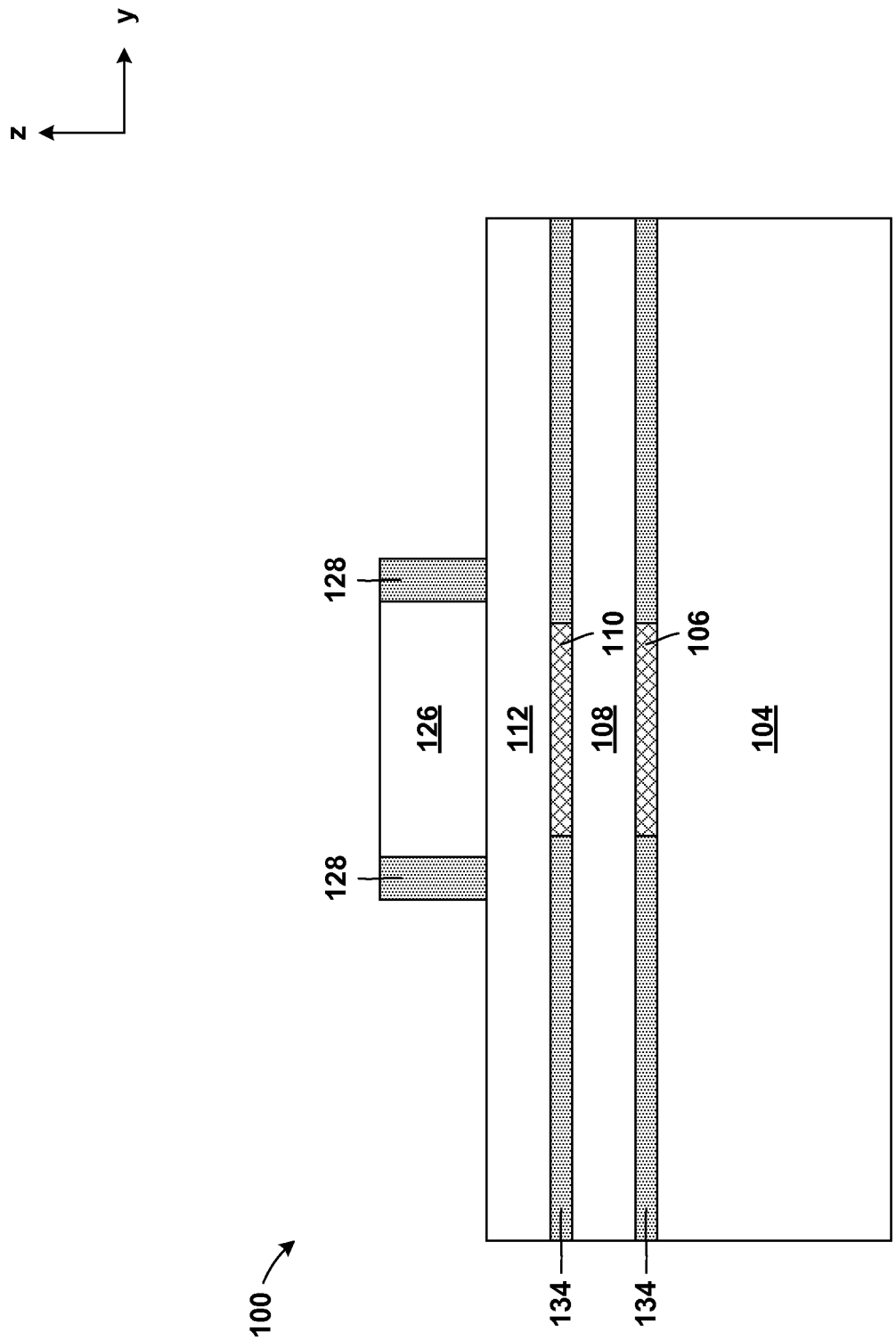
FIG. 22 is a cross section view of FIG. 21, taken along section line A-A.
Figure 23:
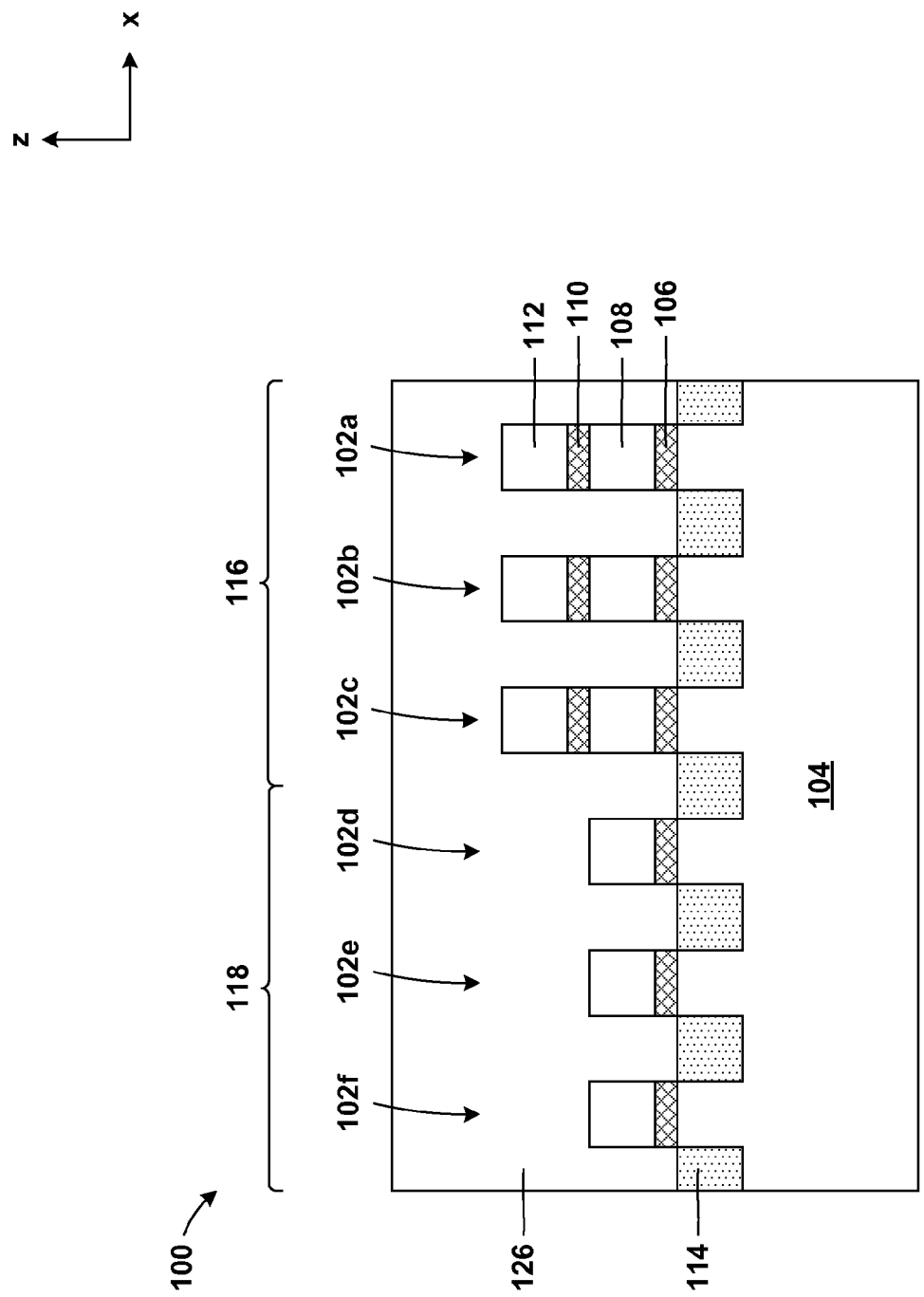
FIG. 23 is a cross section view of FIG. 21, taken along section line B-B.
Figure 24:
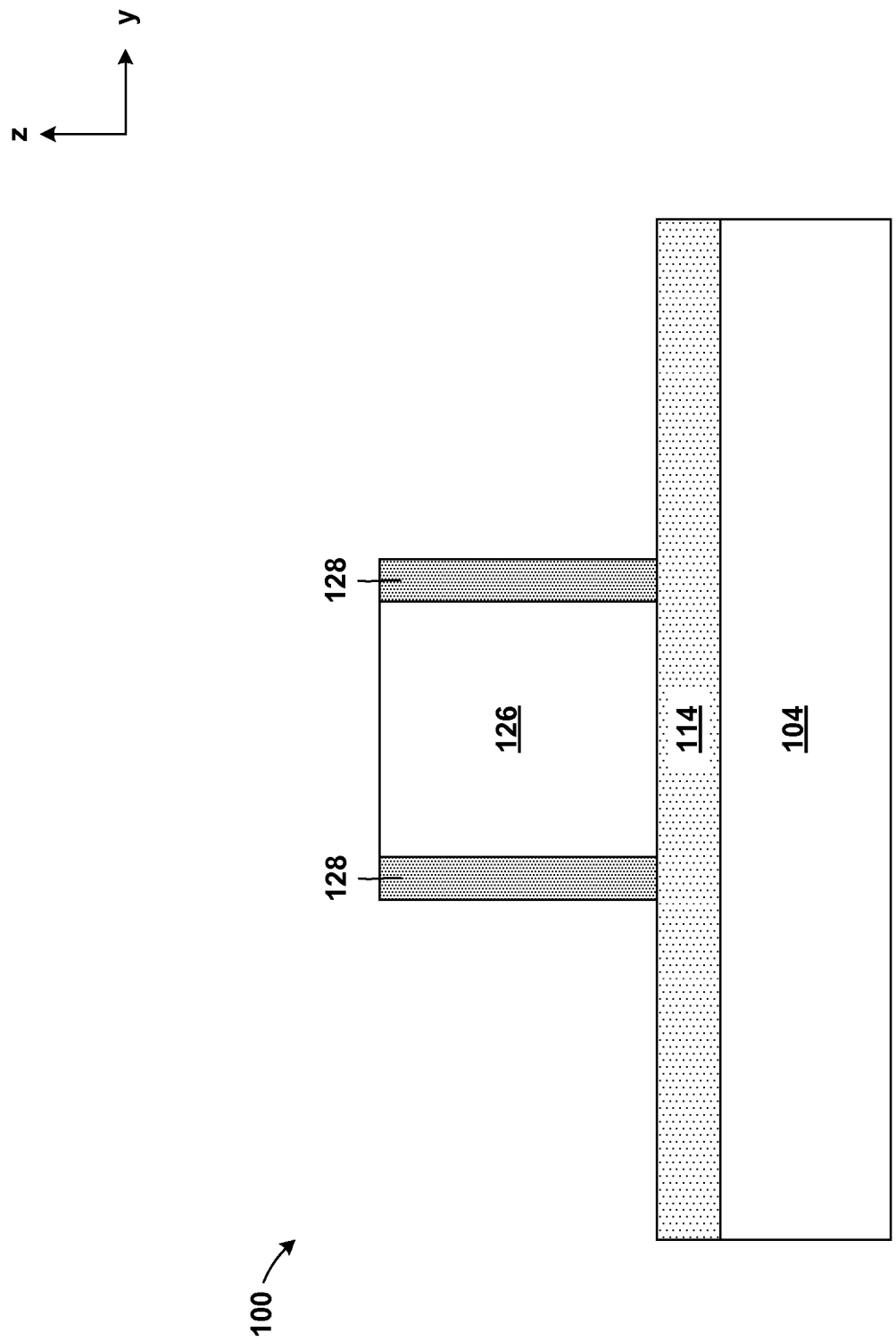
FIG. 24 is a cross section view of FIG. 21, taken along section line C-C.
Figure 25:
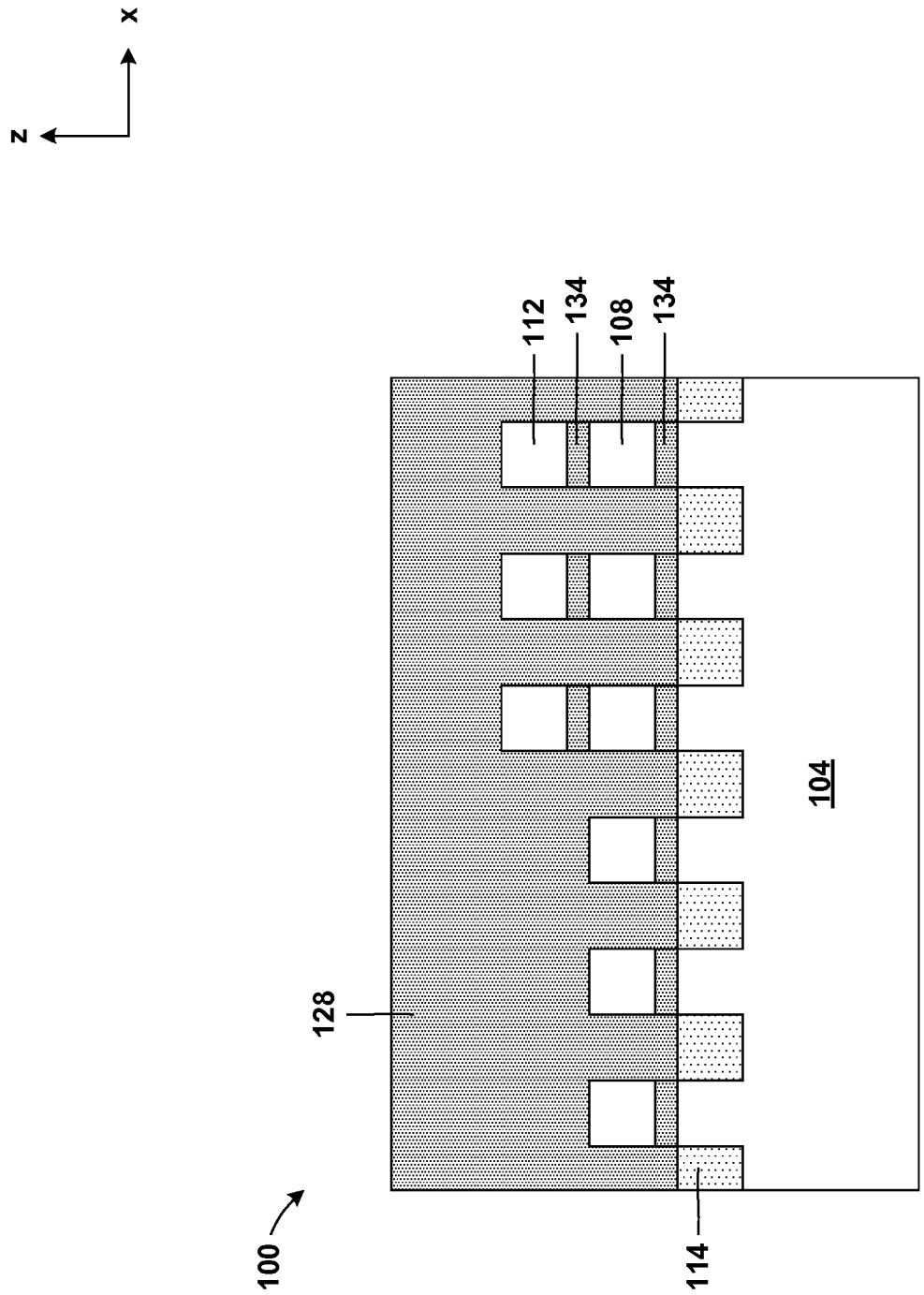
FIG. 25 is a cross section view of FIG. 21, taken along section line D-D.

FIGS. 21, 22, 23, 24, and 25 are a demonstrative illustration of the structure during an intermediate step of a method of fabricating a plurality of finFET devices having a variable number of nano-wires according to one embodiment. More specifically, the method can include filling the first and second openings 130, 132 with a dielectric material 134. FIG. 21 illustrates the structure 100 from a top view. FIG. 22 is a cross section view of FIG. 21 taken along section line A-A. FIG. 23 is a cross section view of FIG. 21 taken along section line B-B. FIG. 24 is a cross section view of FIG. 21 taken along section line C-C. FIG. 25 is a cross section view of FIG. 21 taken along section line D-D.

The openings 130, 132 may be filled with the dielectric material 134 by depositing using any suitable technique known in the art. The dielectric material 134 may optimally fill the first and second openings 130, 132. In one embodiment, the dielectric material 134 may include a similar material as the sidewall spacers 128 above. In one embodiment, the dielectric material 134 may include silicon nitride. In one embodiment, the dielectric material 134 may be deposited using and anisotropically etched away from the sidewalls of the nanowire channels 108, 112, and from the exposed horizontal surfaces. In one embodiment, the dielectric material 134 may remain on the sidewall of the sidewall spacers 128.

Figure 26:
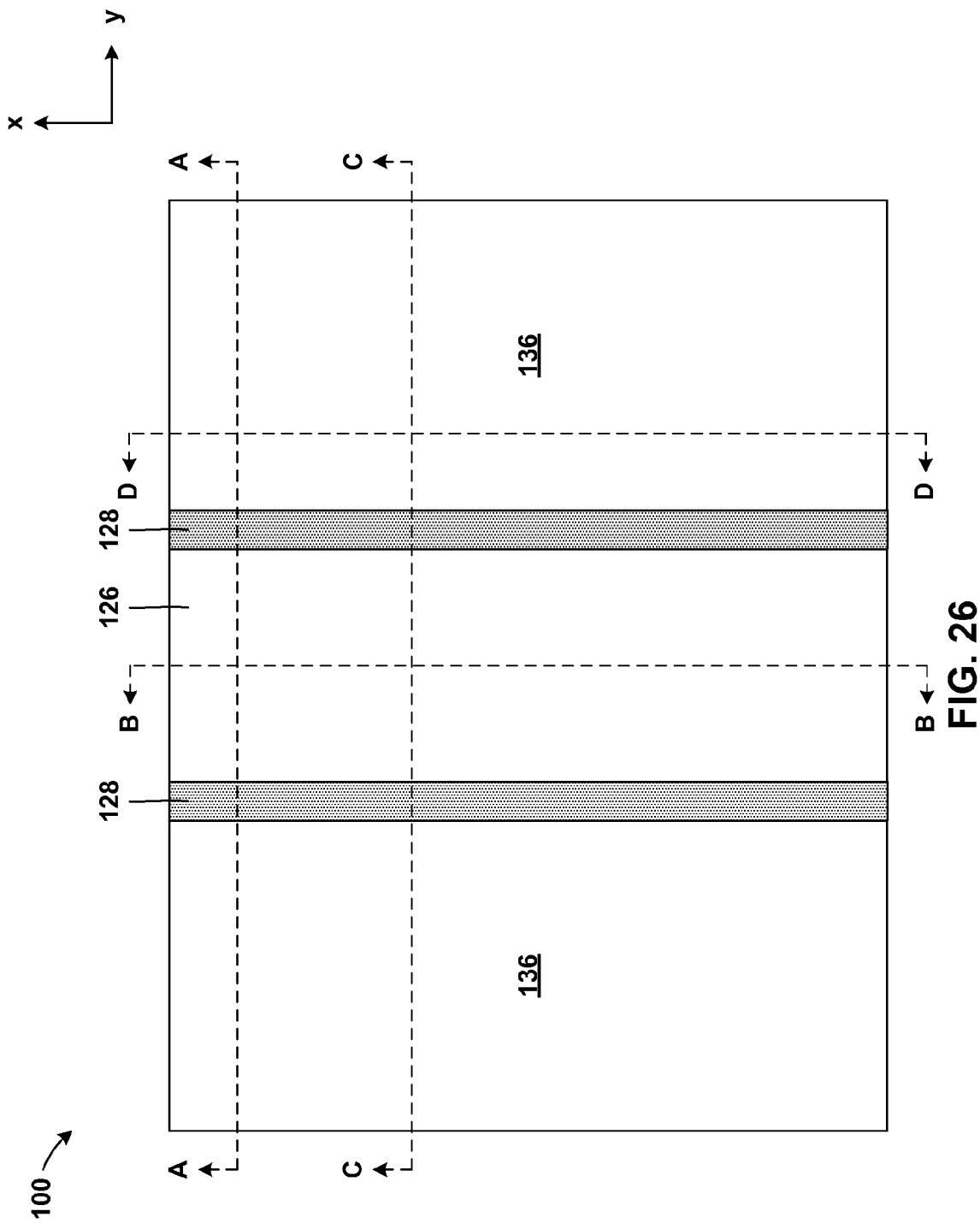
FIG. 26 is a top view of the structure and illustrates forming a source-drain region and a gate spacer according to an exemplary embodiment.
Figure 27:
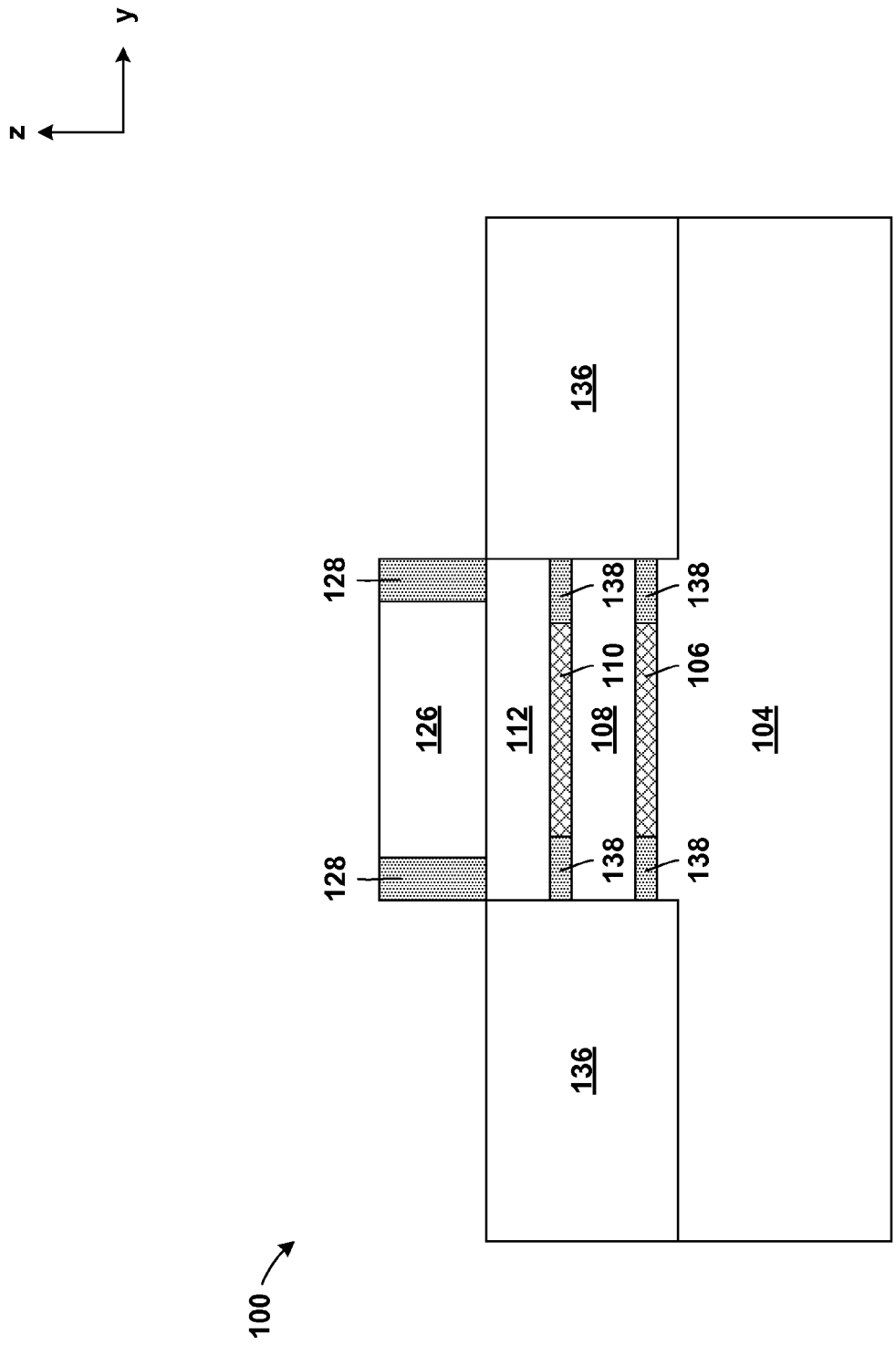
FIG. 27 is a cross section view of FIG. 26, taken along section line A-A.
Figure 28:
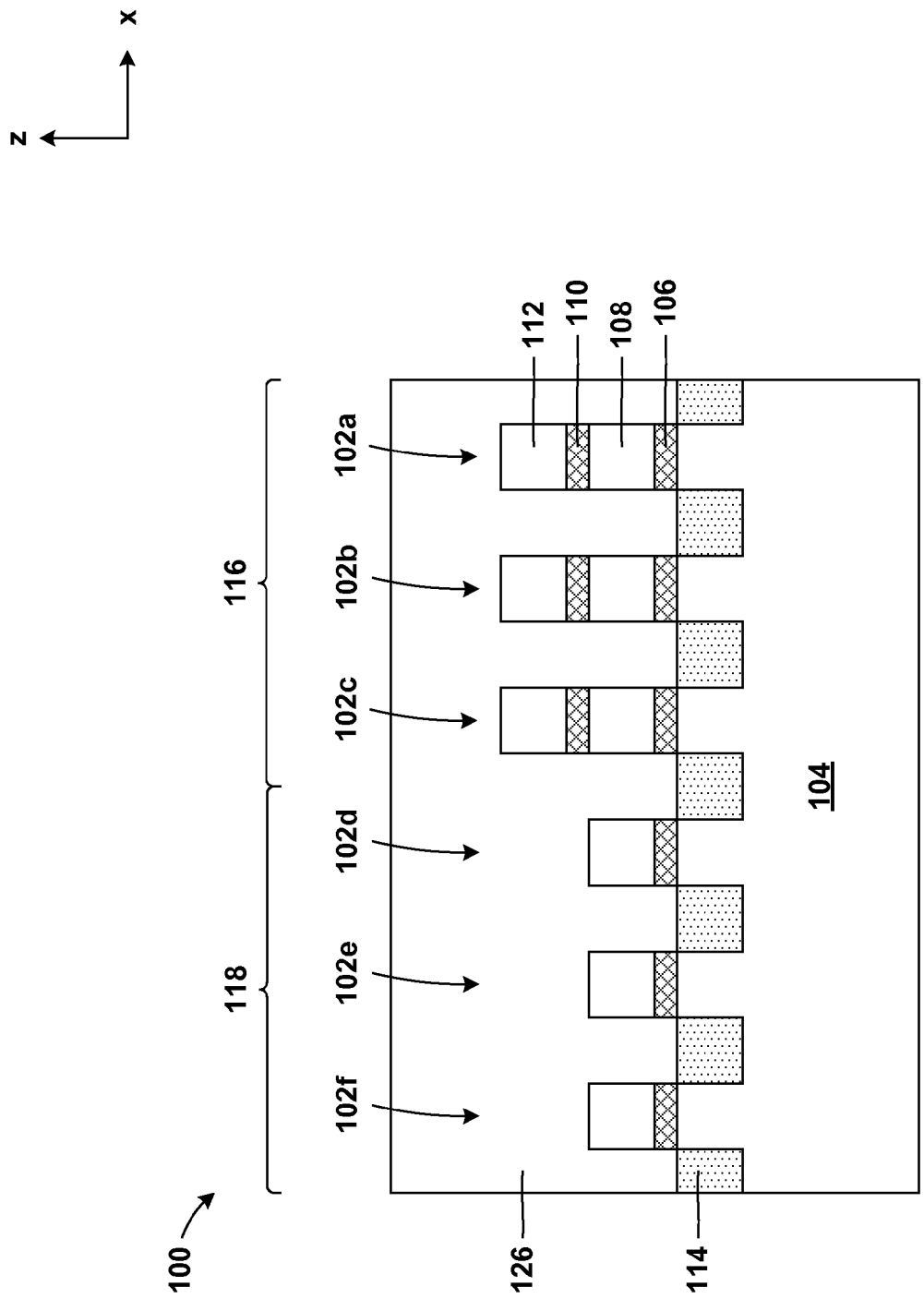
FIG. 28 is a cross section view of FIG. 26, taken along section line B-B.
Figure 29:
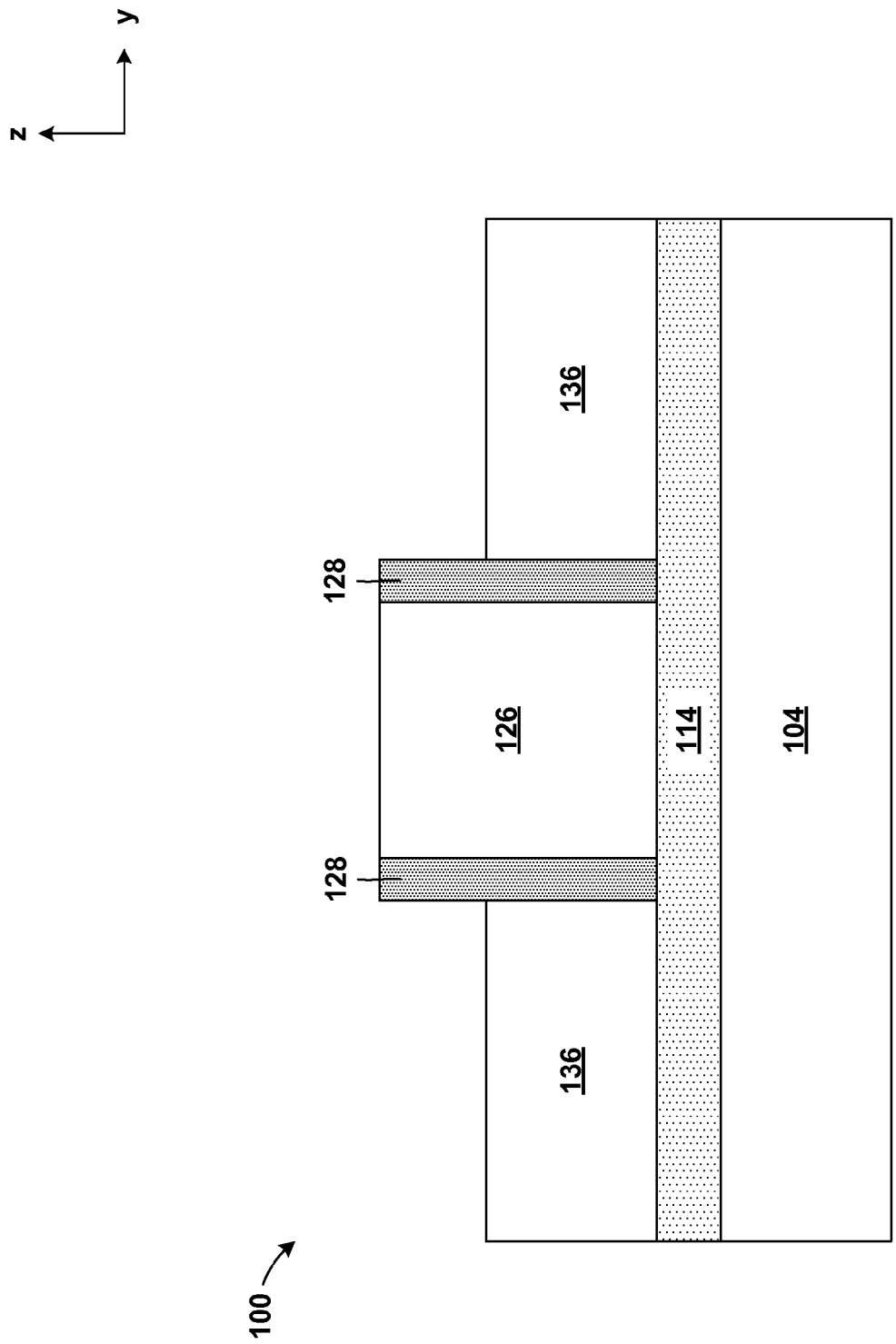
FIG. 29 is a cross section view of FIG. 26, taken along section line C-C.
Figure 30:
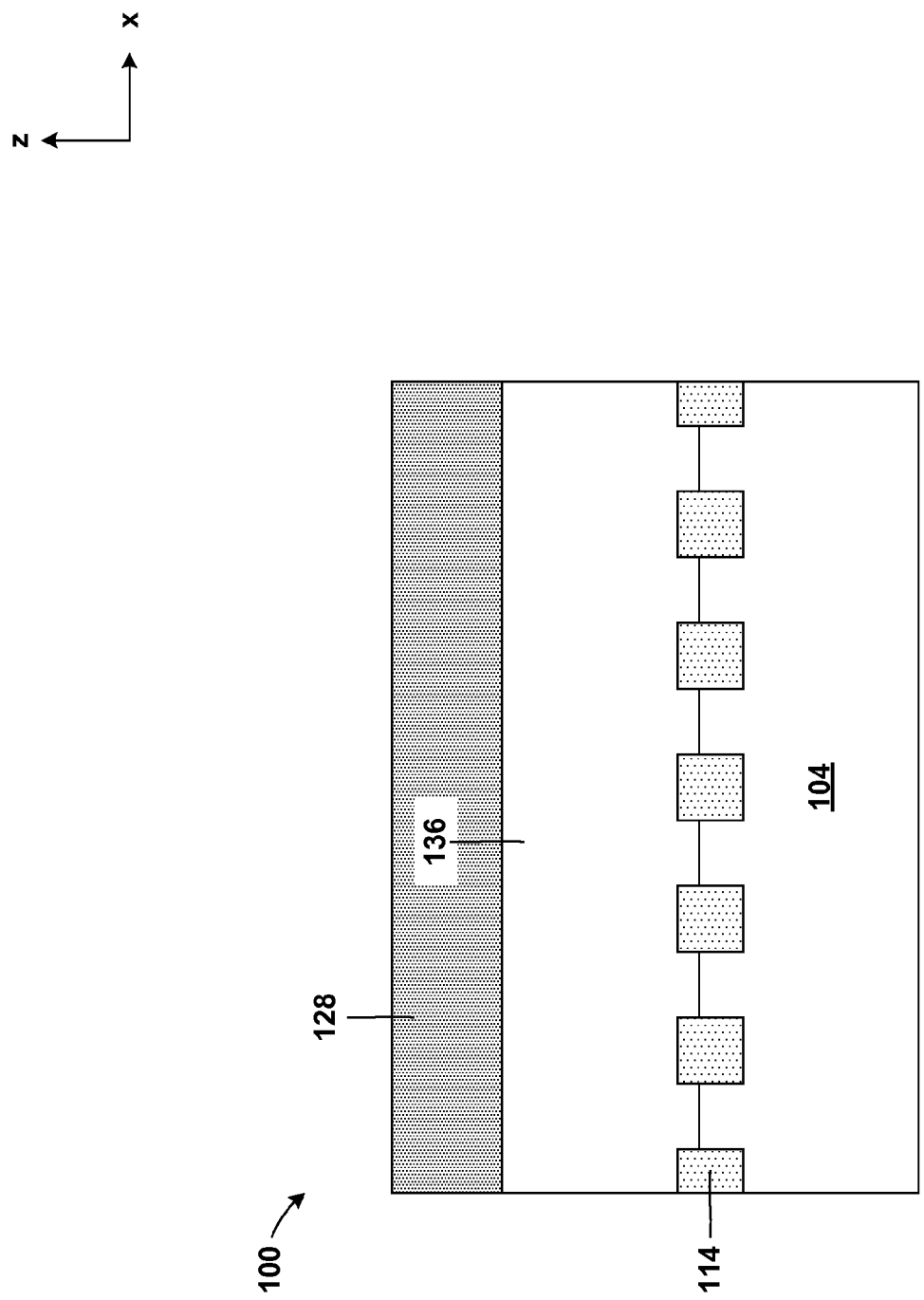
FIG. 30 is a cross section view of FIG. 26, taken along section line D-D.

FIGS. 26, 27, 28, 29, and 30 are a demonstrative illustration of the structure during an intermediate step of a method of fabricating a plurality of finFET devices having a variable number of nano-wires according to one embodiment. More specifically, the method can include forming source-drain regions 136, and a gate spacer 138. FIG. 26 illustrates the structure 100 from a top view. FIG. 27 is a cross section view of FIG. 26 taken along section line A-A. FIG. 28 is a cross section view of FIG. 26 taken along section line B-B. FIG. 29 is a cross section view of FIG. 26 taken along section line C-C. FIG. 30 is a cross section view of FIG. 26 taken along section line D-D.

First, a source-drain opening is defined adjacent to the sidewall spacer 128 by etching the substrate 104 and a portion of the nanowire stacks 102*a*-102*f* not covered by the dummy gate 126 or the sidewall spacer 128. In doing so, a portion of the first and second nanowire channels 108, 112 not covered by the dummy gate 126 or the sidewall spacer 128 may be removed. Also, a portion of the dielectric material 134 between the substrate 104 and the first nanowire channel 108, and a portion of the dielectric material 134 between the first and second nanowire channels 108, 112 may be removed to form a gate spacer 138. The gate spacer 138 may include any portions of the dielectric material 134 remaining beneath the sidewall spacer 128 and the dummy gate 126. Therefore, as illustrated, the gate spacer 138 may separate the second portion of the first and second sacrificial spacers 106, 110 from the subsequently formed source-drain region 136.

Next, a source-drain region 136 may be formed by epitaxially growing a semiconductor material in the source-drain opening. In one embodiment the source-drain region 138 may be in-situ doped with either an n-type dopant or a p-type dopant depending on the desired characteristics of the final structure. In one embodiment, the source-drain region 136 may include doped silicon. It should be noted that the source-drain region 136, of the present embodiment, is in direct contact with the ends of both the first and second nanowire channels 108, 112. In some embodiments, the source-drain opening may be self-aligned to the sidewall spacer 128. It may be noted that the gate spacer 138 may generally insulate the subsequently formed gate regions from the source-drain regions 136. The source-drain regions 136 may be in physical contact, and thus be in electrical contact with, each of the nanowire channels 108, 112. As such, each nanowire channel (108, 112) and the corresponding source and drain region are of unitary construction and no material interface is located between them.

Figure 31:
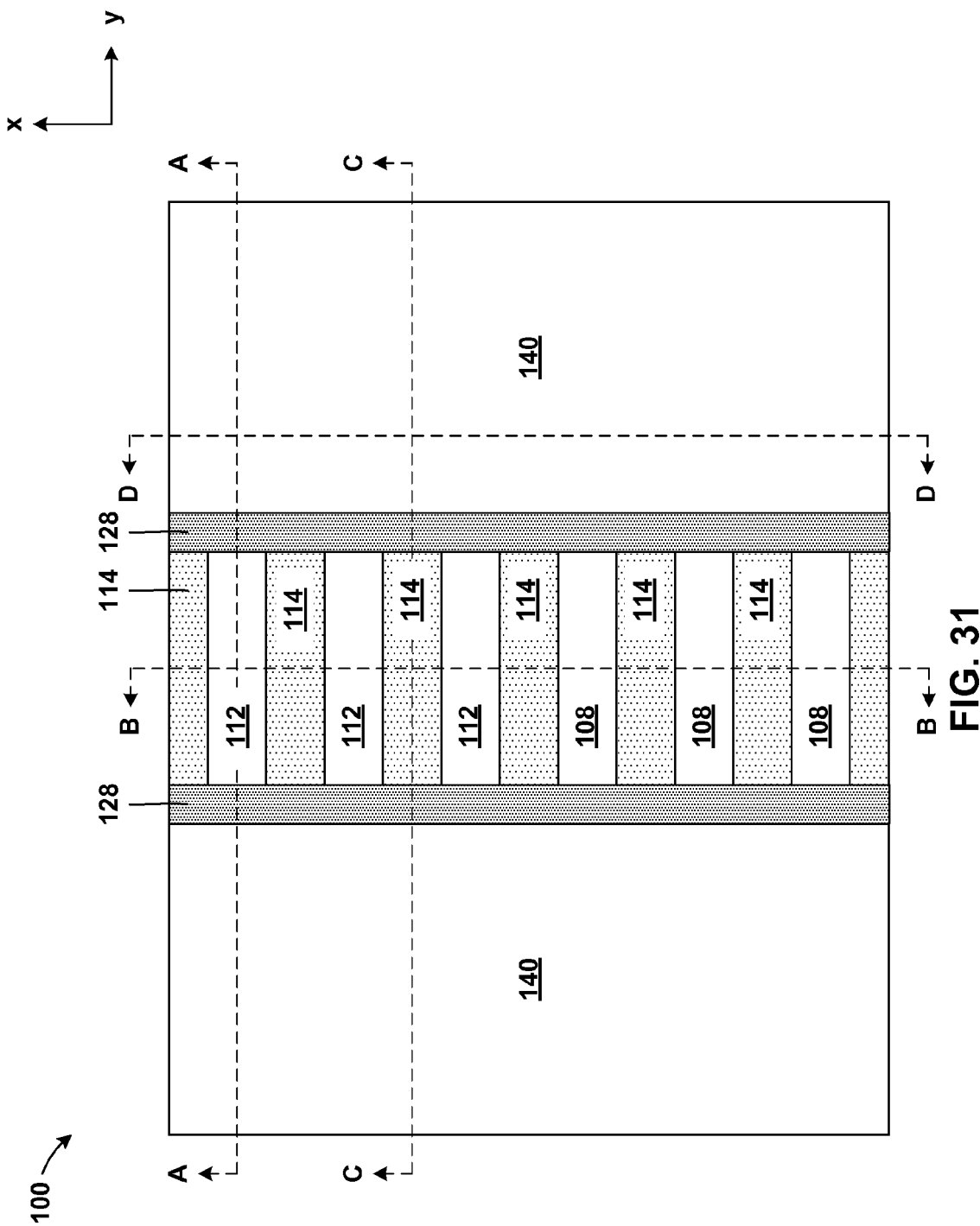
FIG. 31 is a top view of the structure and illustrates depositing an inter-level dielectric layer and subsequently removing the dummy gate according to an exemplary embodiment.
Figure 32:
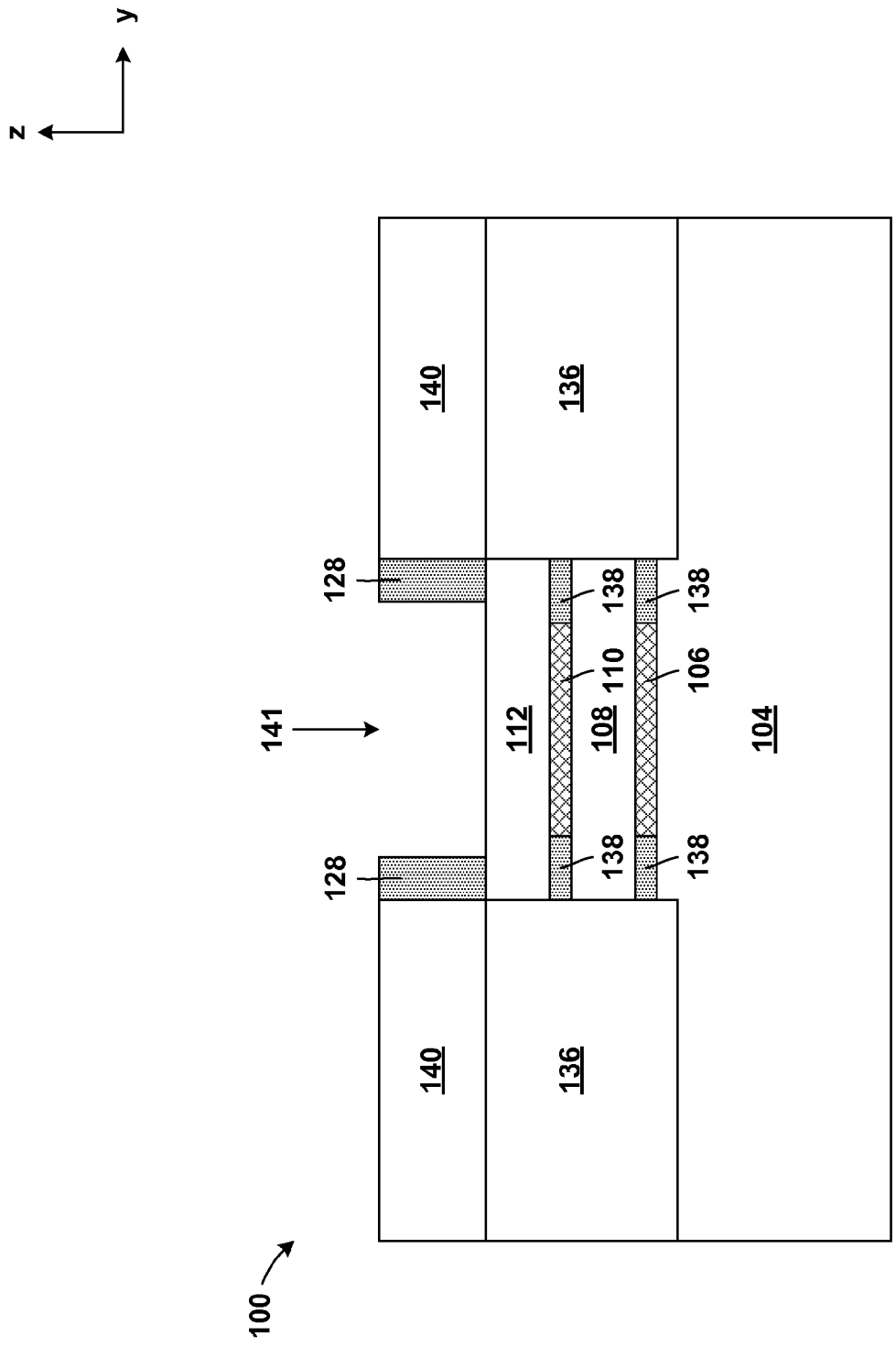
FIG. 32 is a cross section view of FIG. 31, taken along section line A-A.
Figure 33:
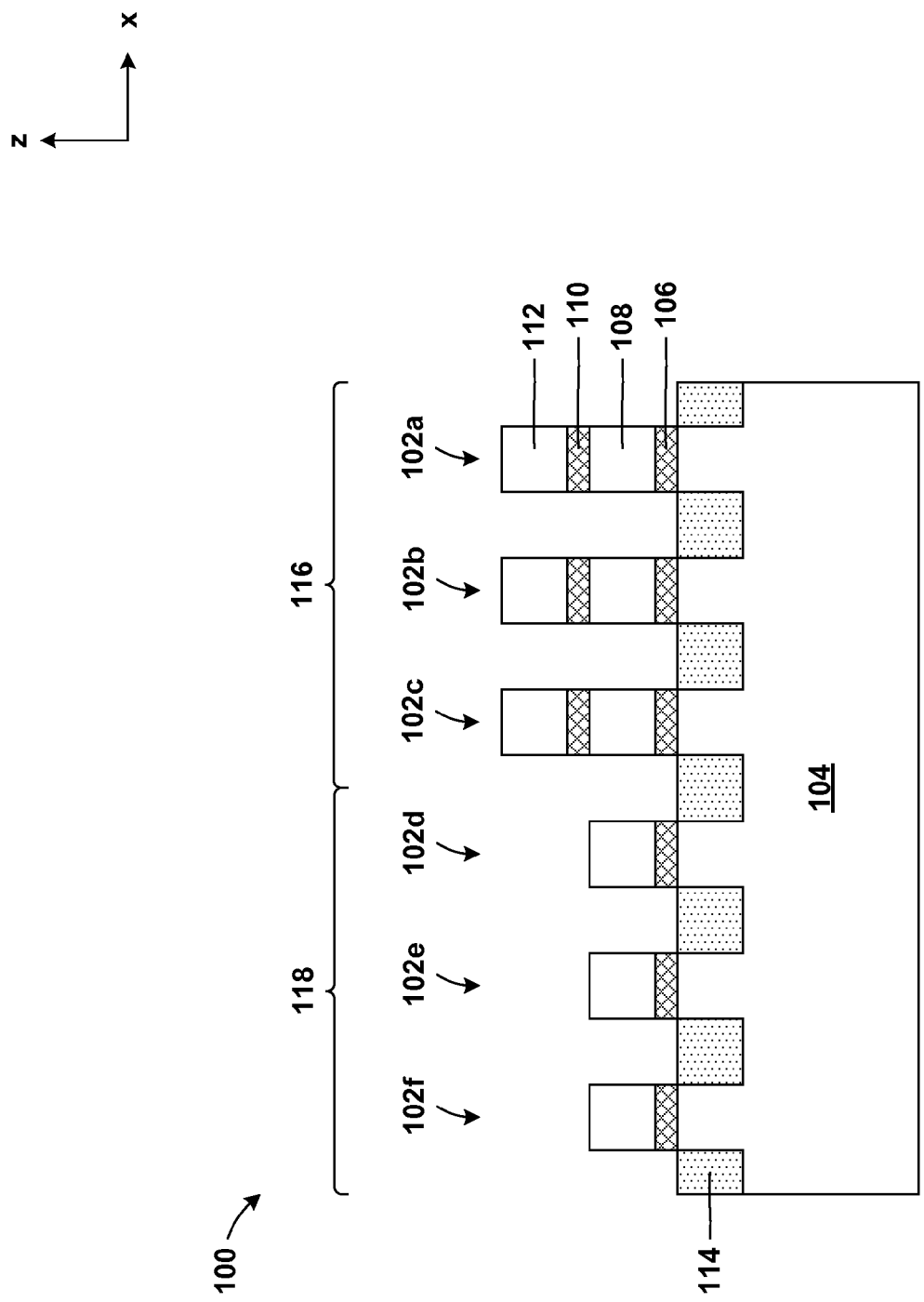
FIG. 33 is a cross section view of FIG. 31, taken along section line B-B.
Figure 34:
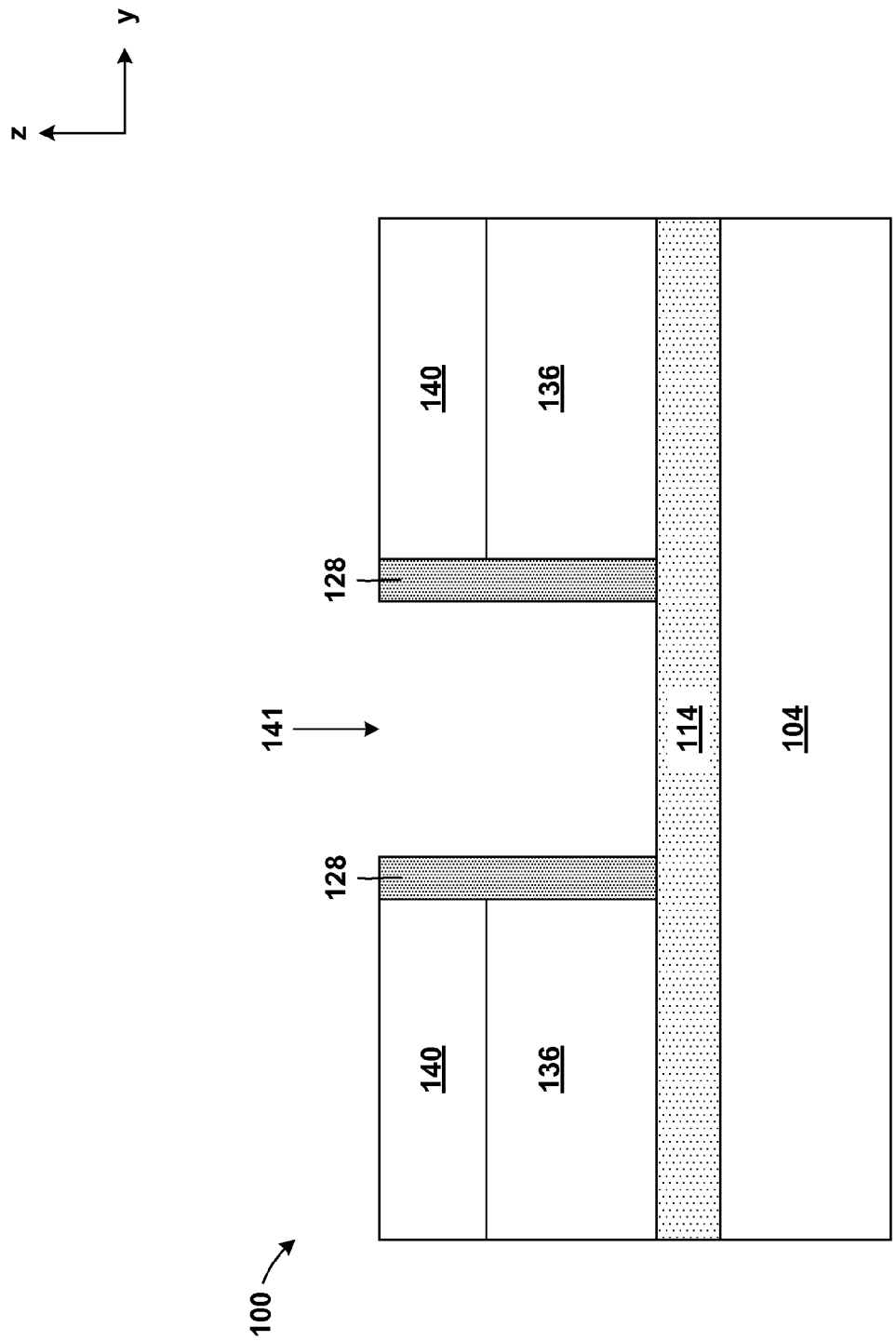
FIG. 34 is a cross section view of FIG. 31, taken along section line C-C.
Figure 35:
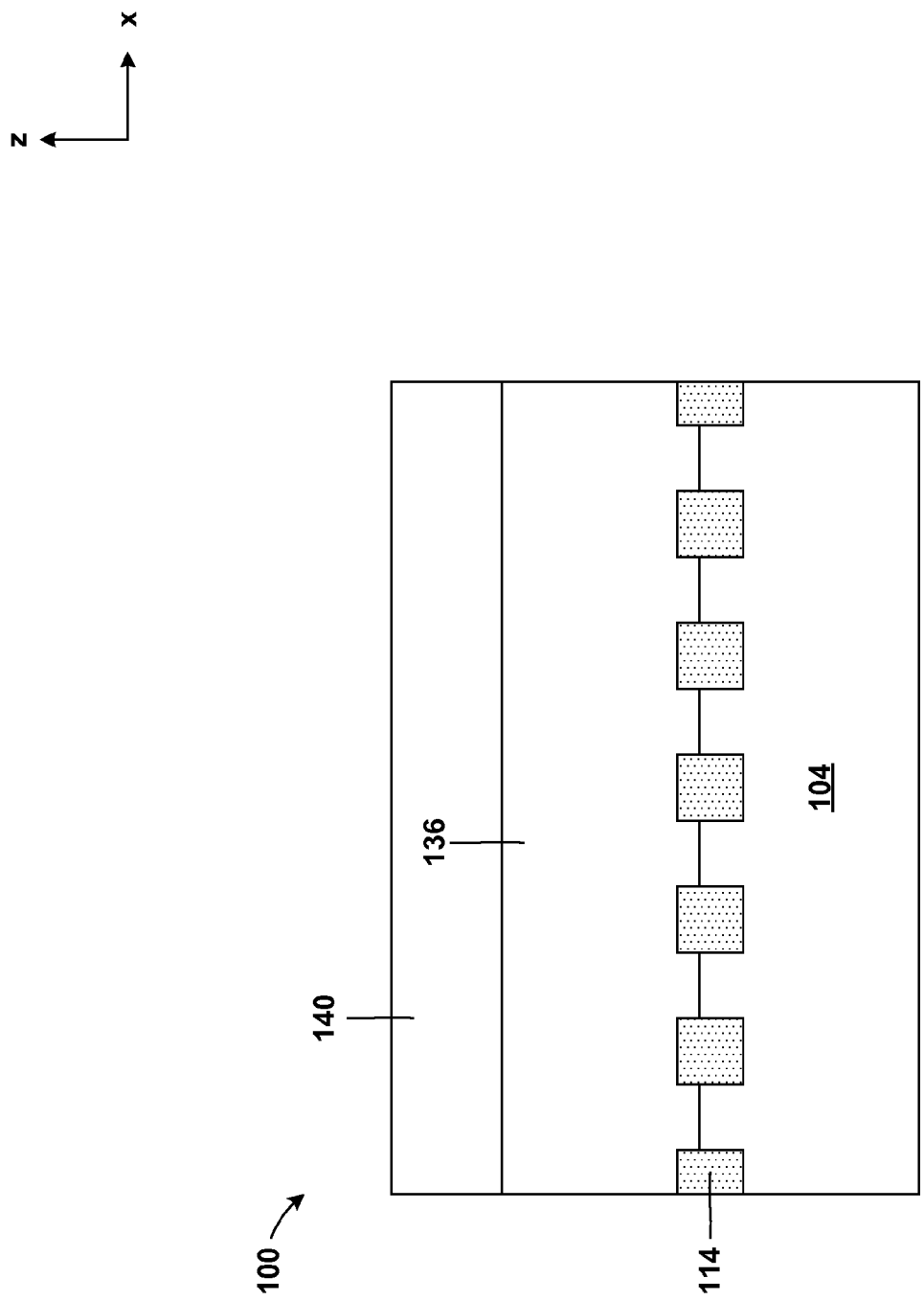
FIG. 35 is a cross section view of FIG. 31, taken along section line D-D.

FIGS. 31, 32, 33, 34, and 35 are a demonstrative illustration of the structure during an intermediate step of a method of fabricating a plurality of finFET devices having a variable number of nano-wires according to one embodiment. More specifically, the method can include depositing an inter-level dielectric 140 followed by removing the dummy gate 126. FIG. 31 illustrates the structure 100 from a top view. FIG. 32 is a cross section view of FIG. 31 taken along section line A-A. FIG. 33 is a cross section view of FIG. 31 taken along section line B-B. FIG. 34 is a cross section view of FIG. 31 taken along section line C-C. FIG. 35 is a cross section view of FIG. 31 taken along section line D-D.

The inter-level dielectric 140 may generally be deposited above the entire structure 100. The inter-level dielectric 140 may include any suitable dielectric material, for example, silicon oxide ($SiO_2$), silicon nitride ($Si_3N_4$), hydrogenated silicon carbon oxide (SiCOH), silicon based low-k dielectrics, or porous dielectrics. Known suitable deposition techniques, such as, for example, atomic layer deposition, chemical vapor deposition, plasma enhanced chemical vapor deposition, spin on deposition, or physical vapor deposition may be used to form the inter-level dielectric 140. Next, a chemical mechanical polishing technique may be applied to remove excess material from a top surface of the structure 100 and expose the dummy gate 126.

The dummy gate 126 may then be substantially removed from the gate region of the structure 100. The dummy gate 126 may be removed selective to the STI 114 and the nanowire stacks 102*a*-102*f*. Furthermore, the chosen inter-level dielectric 140 may be resistant to the etching technique chosen to remove the dummy gate 126. In one embodiment, the selective removal of the dummy gate 126 may be accomplished by using any known etching technique suitable to remove polysilicon selective to silicon oxide or silicon nitride. In one embodiment, for example, the dummy gate 126 may be removed using a dry etching technique, for example reactive ion etching. Removal of the dummy gate 126 creates a trench 141 between the sidewall spacers 128.

Figure 36:
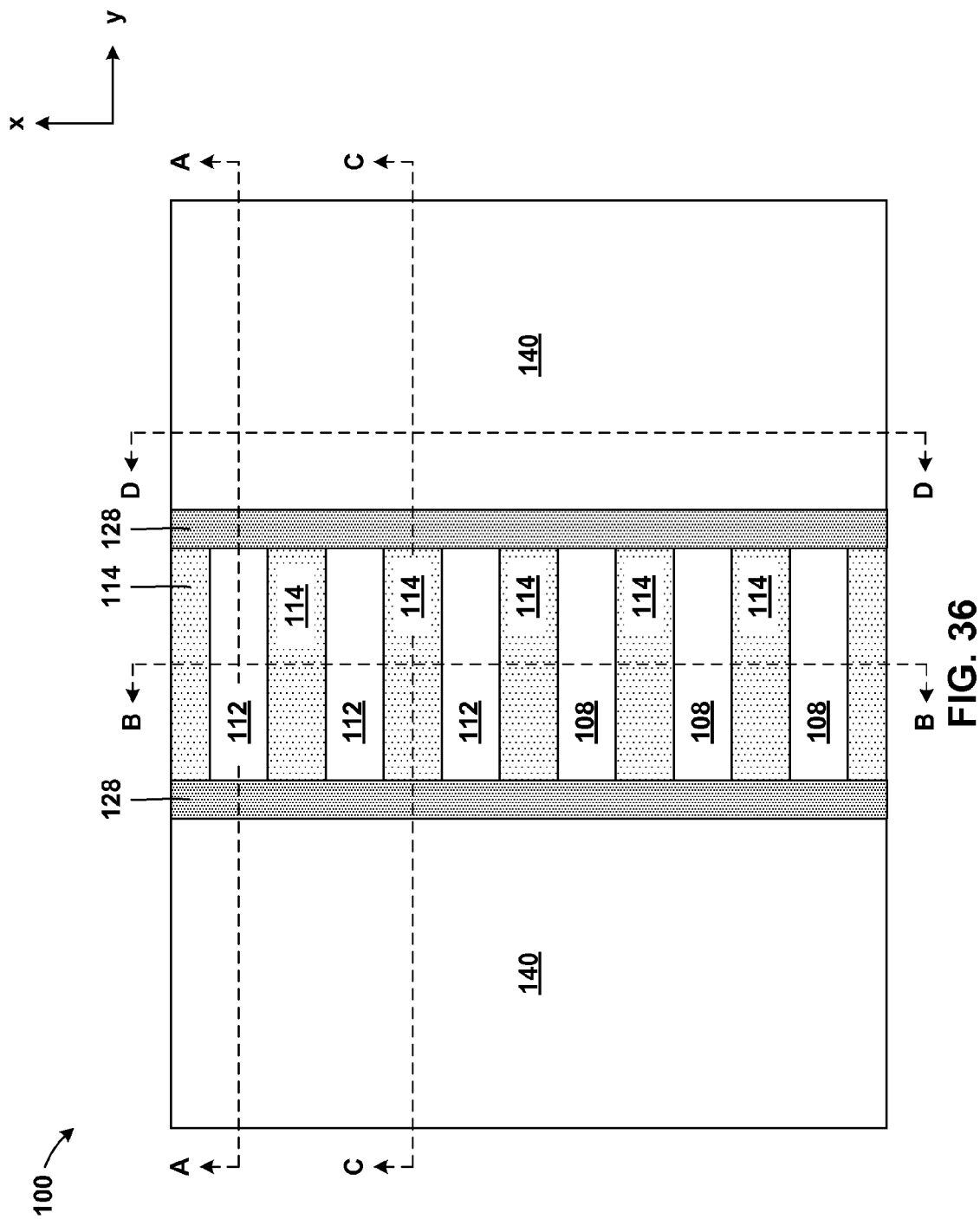
FIG. 36 is a top view of the structure and illustrates selective removal of a second portion of the first and second sacrificial layers according to an exemplary embodiment.
Figure 37:
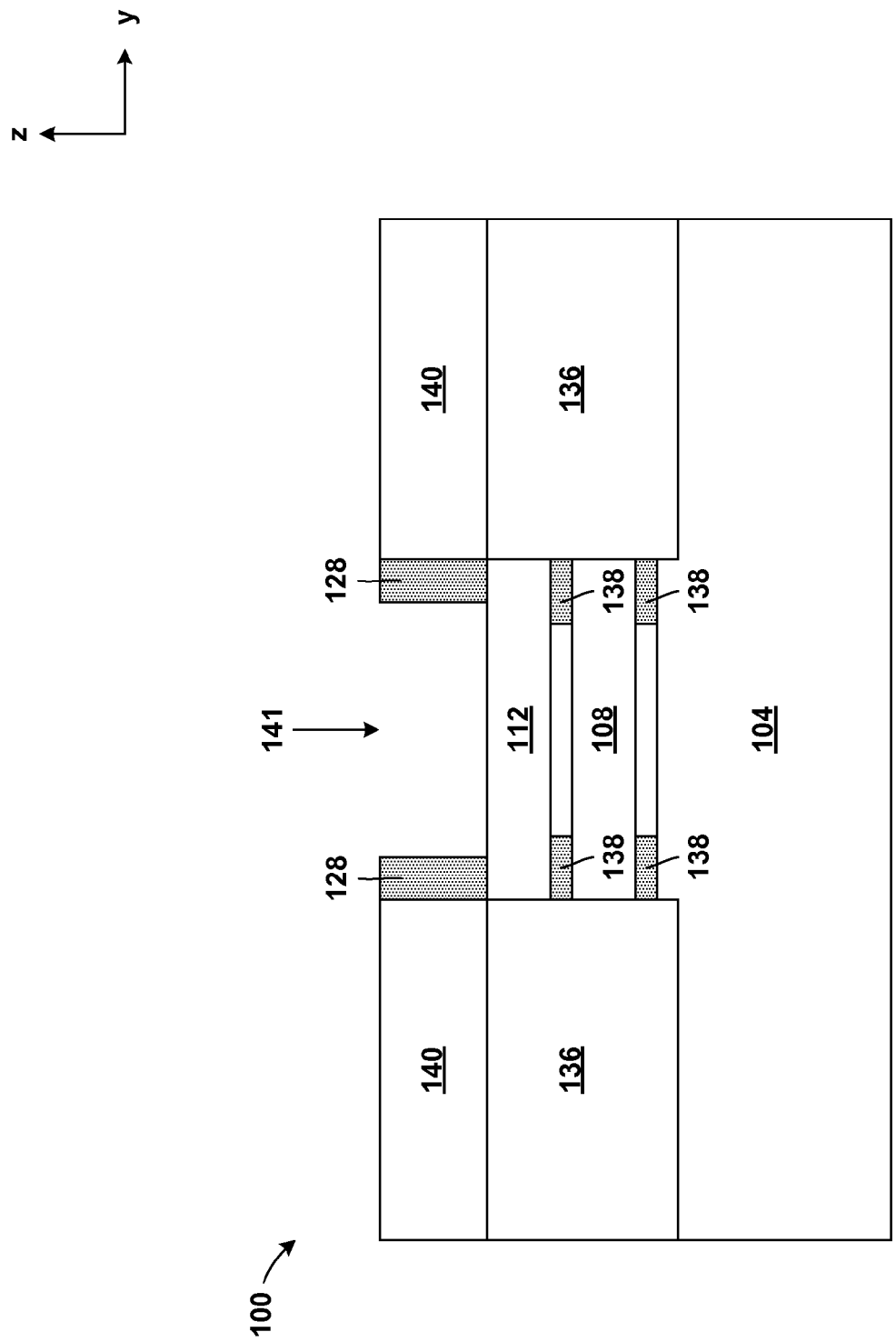
FIG. 37 is a cross section view of FIG. 36, taken along section line A-A.
Figure 38:
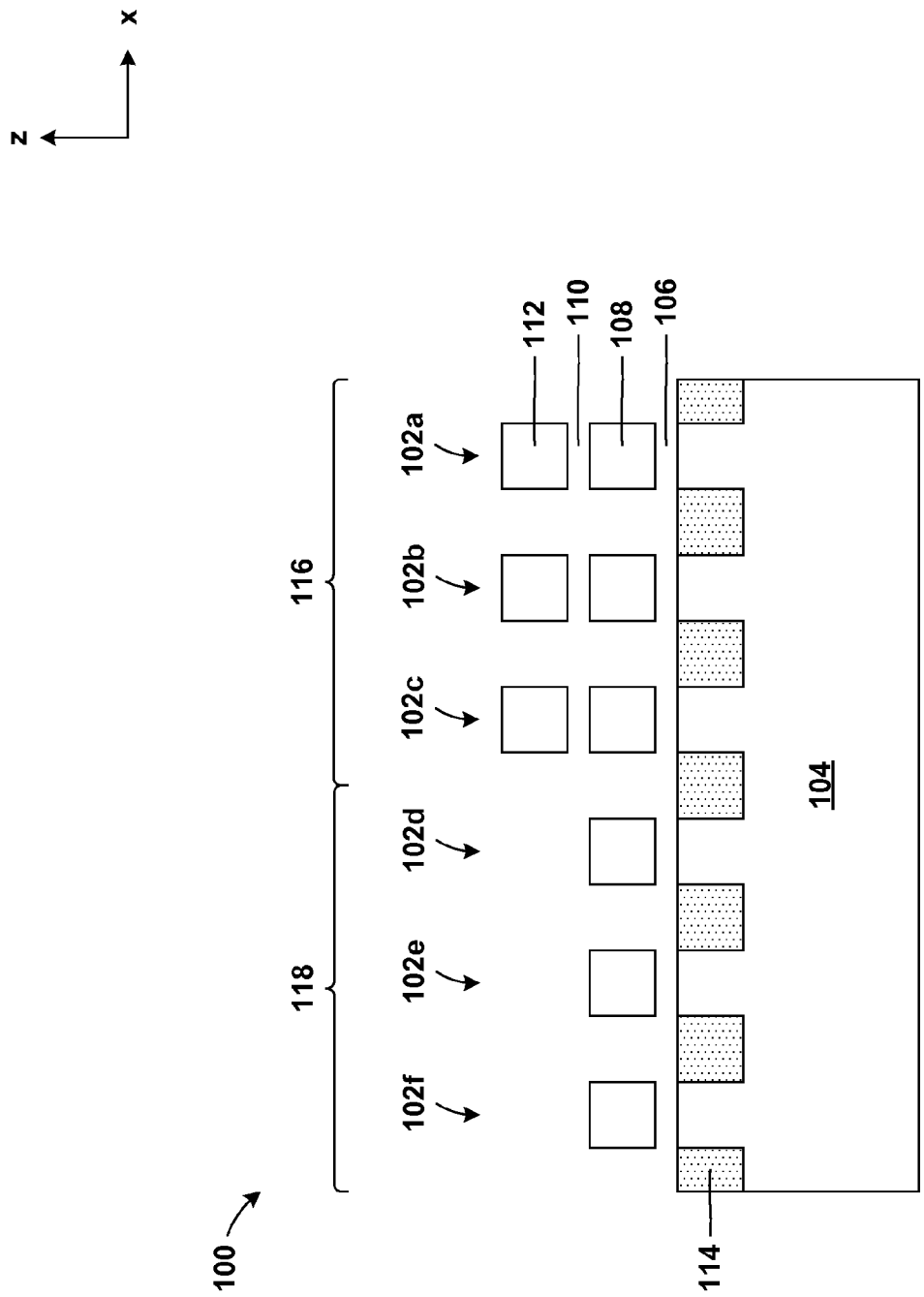
FIG. 38 is a cross section view of FIG. 36, taken along section line B-B.
Figure 39:
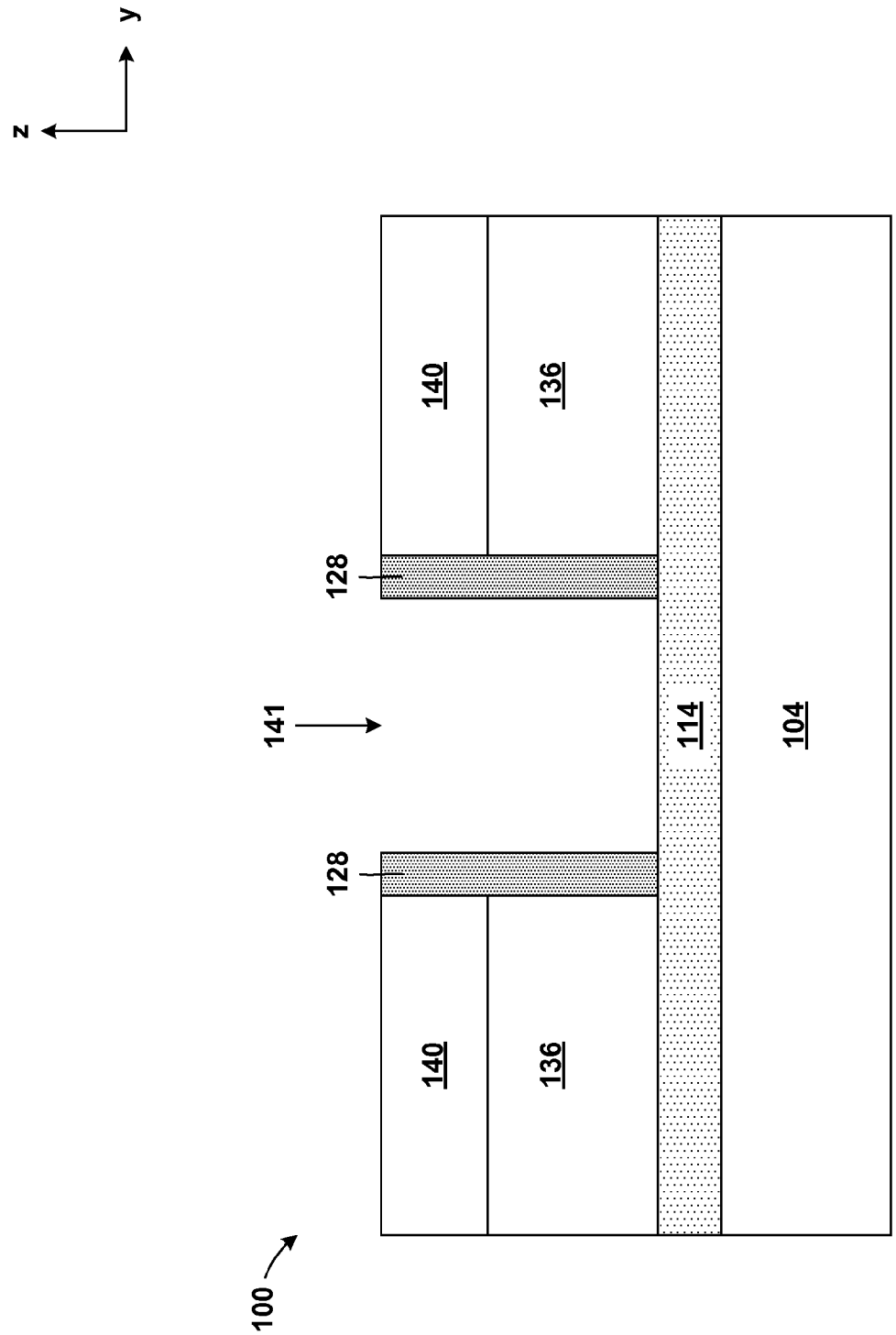
FIG. 39 is a cross section view of FIG. 36, taken along section line C-C.
Figure 40:
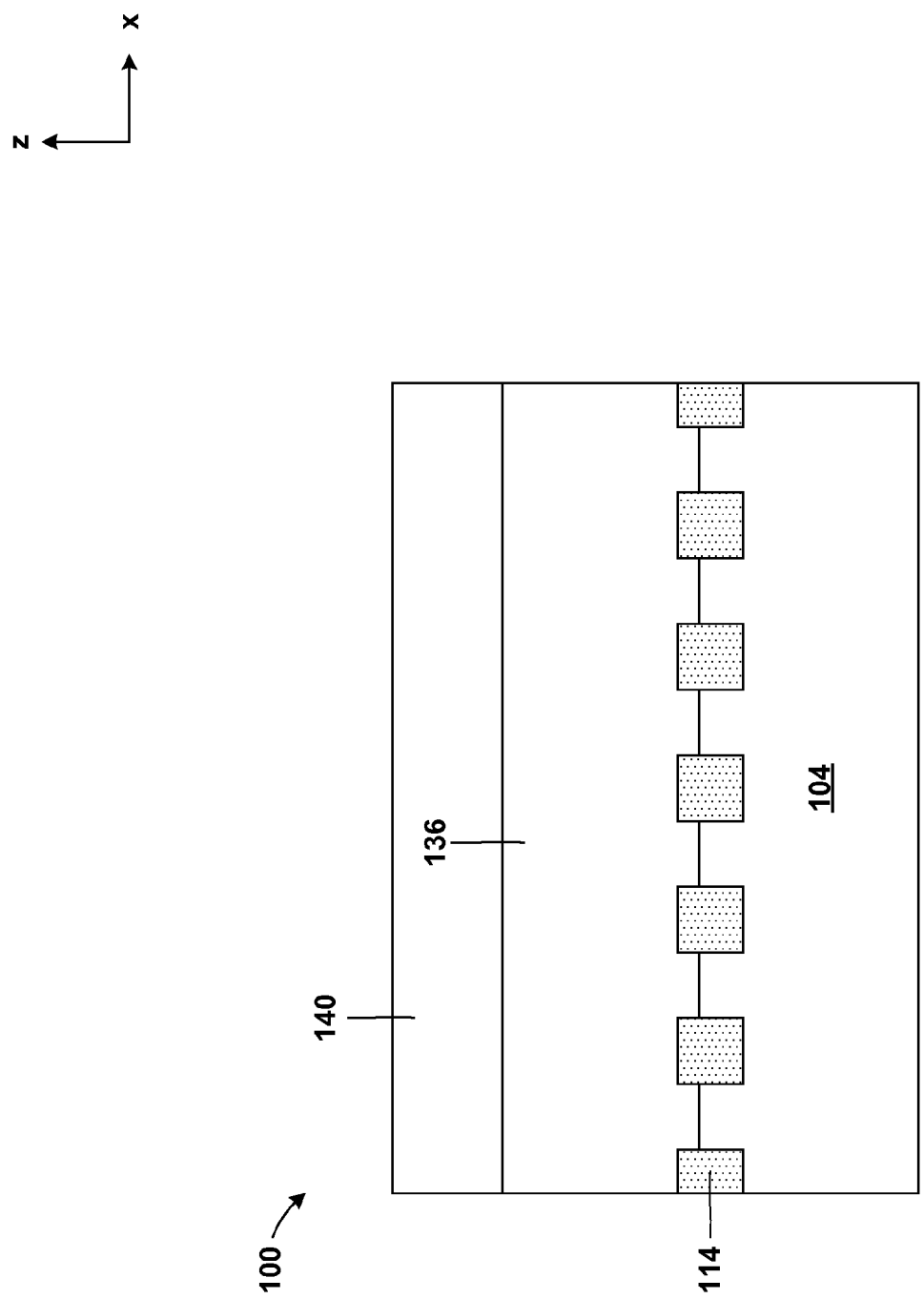
FIG. 40 is a cross section view of FIG. 36, taken along section line D-D.

FIGS. 36, 37, 38, 39, and 40 are a demonstrative illustration of the structure during an intermediate step of a method of fabricating a plurality of finFET devices having a variable number of nano-wires according to one embodiment. More specifically, the method can include removal of the second portion of the first and second sacrificial spacers 106, 110 from between the first and second nanowire channels 108, 112. FIG. 36 illustrates the structure 100 from a top view. FIG. 37 is a cross section view of FIG. 36 taken along section line A-A. FIG. 38 is a cross section view of FIG. 36 taken along section line B-B. FIG. 39 is a cross section view of FIG. 36 taken along section line C-C. FIG. 40 is a cross section view of FIG. 36 taken along section line D-D.

The second portion the first and second sacrificial spacers 106, 110 may then be substantially removed from between the first and second nanowire channels 108, 112 in the gate region of the structure 100. The second portion of the first and second sacrificial spacers 106, 110 may be removed selective to the first and second nanowire channels 108, 112. In one embodiment, the selective removal of the second portion of the first and second sacrificial spacers 106, 110 may be accomplished by using any known etching technique suitable to remove silicon-germanium selective to silicon. In one embodiment, for example, the second portion of the first and second sacrificial spacers 106, 110 may be removed using a, an isotropic wet etch. In one embodiment, the second portion of the first and second sacrificial spacers 106, 110 may be selectively removed by chemically utilizing an etchant that exploits the lower oxidation potential of the sacrificial layers compared to the semiconductor layers, as described above with reference to FIGS. 16, 17, 18, 19, and 20.

Figure 41:
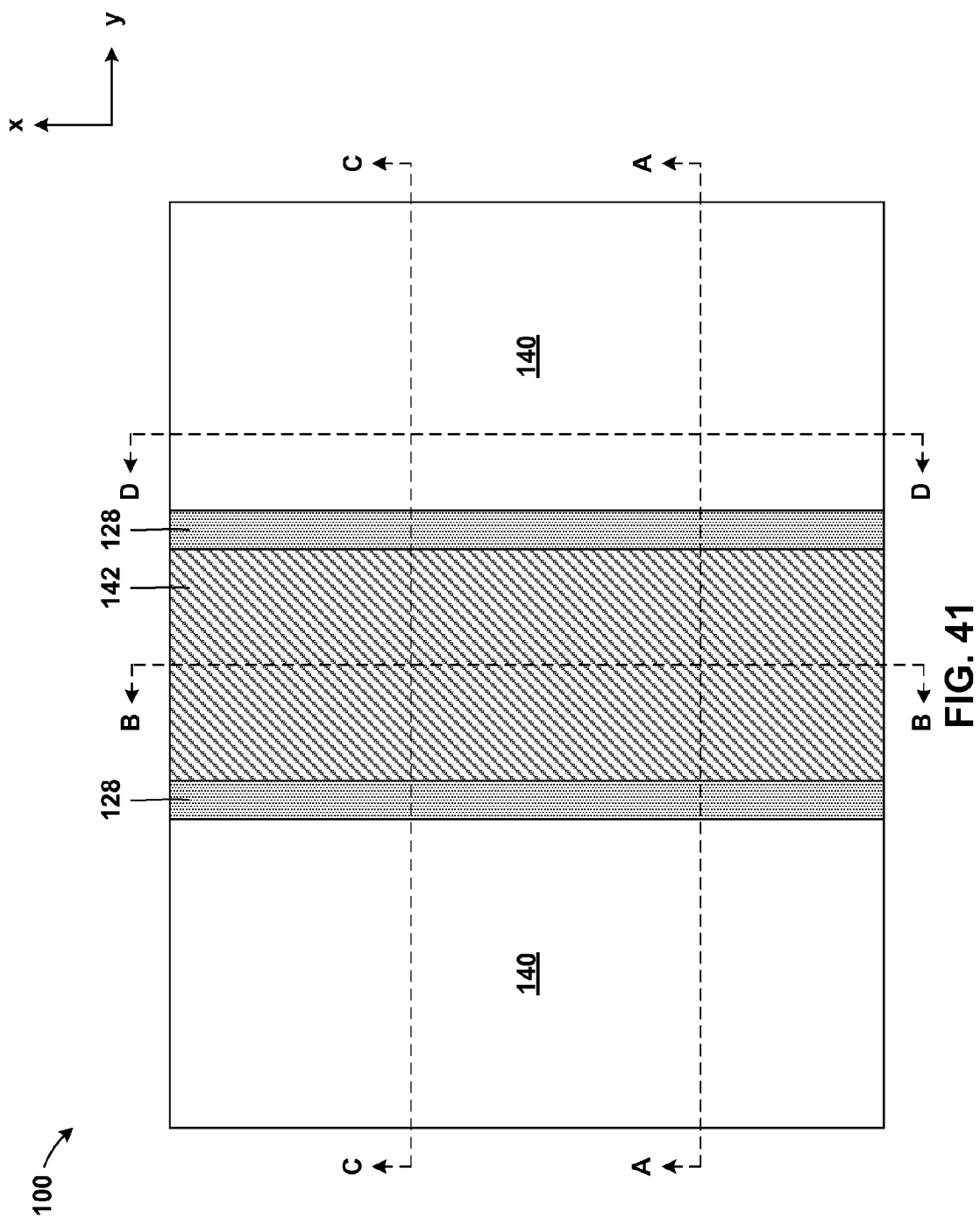
FIG. 41 is a top view of the structure and illustrates forming a gate electrode according to an exemplary embodiment.
Figure 42:
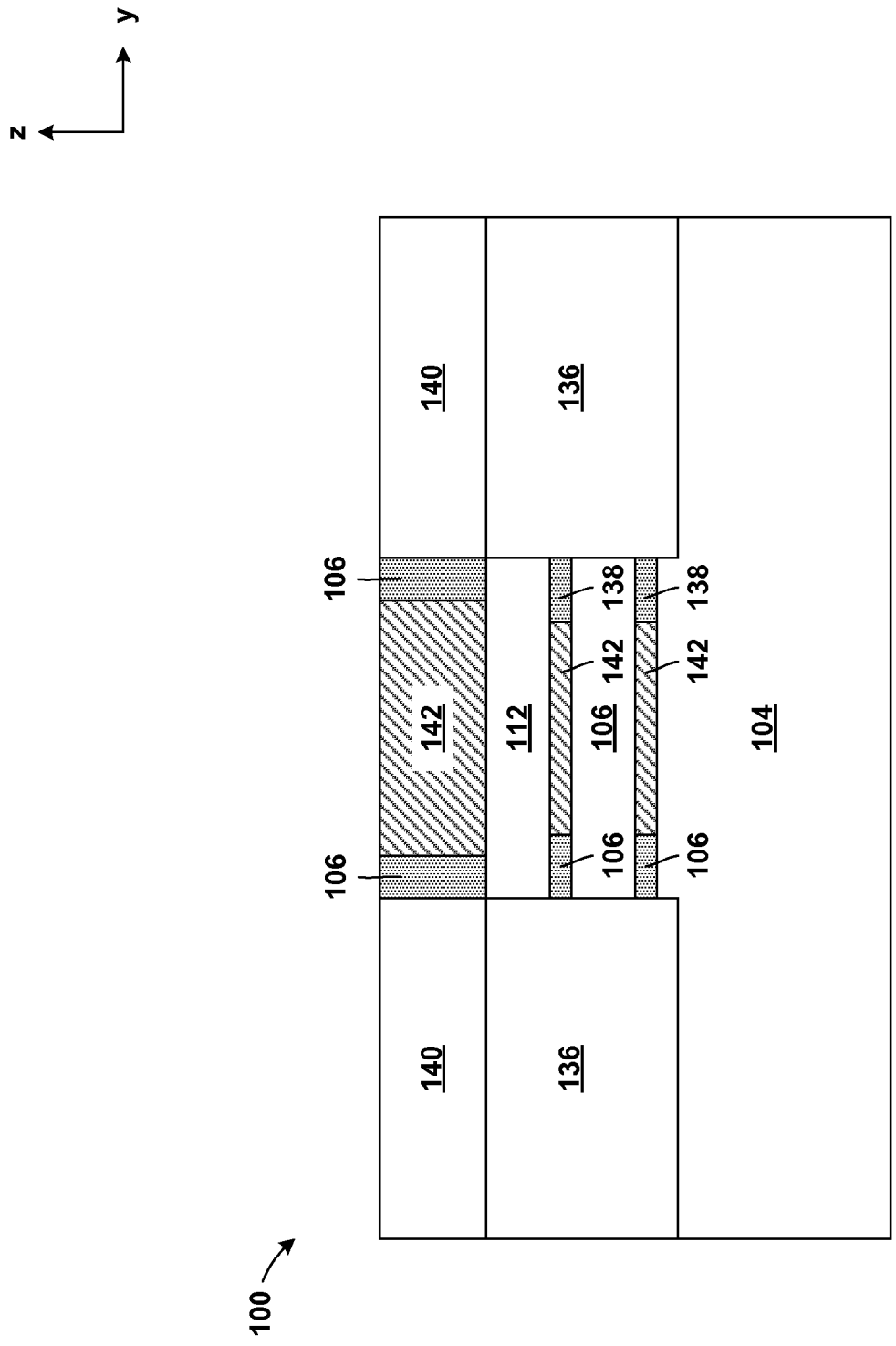
FIG. 42 is a cross section view of FIG. 41, taken along section line A-A.
Figure 43:
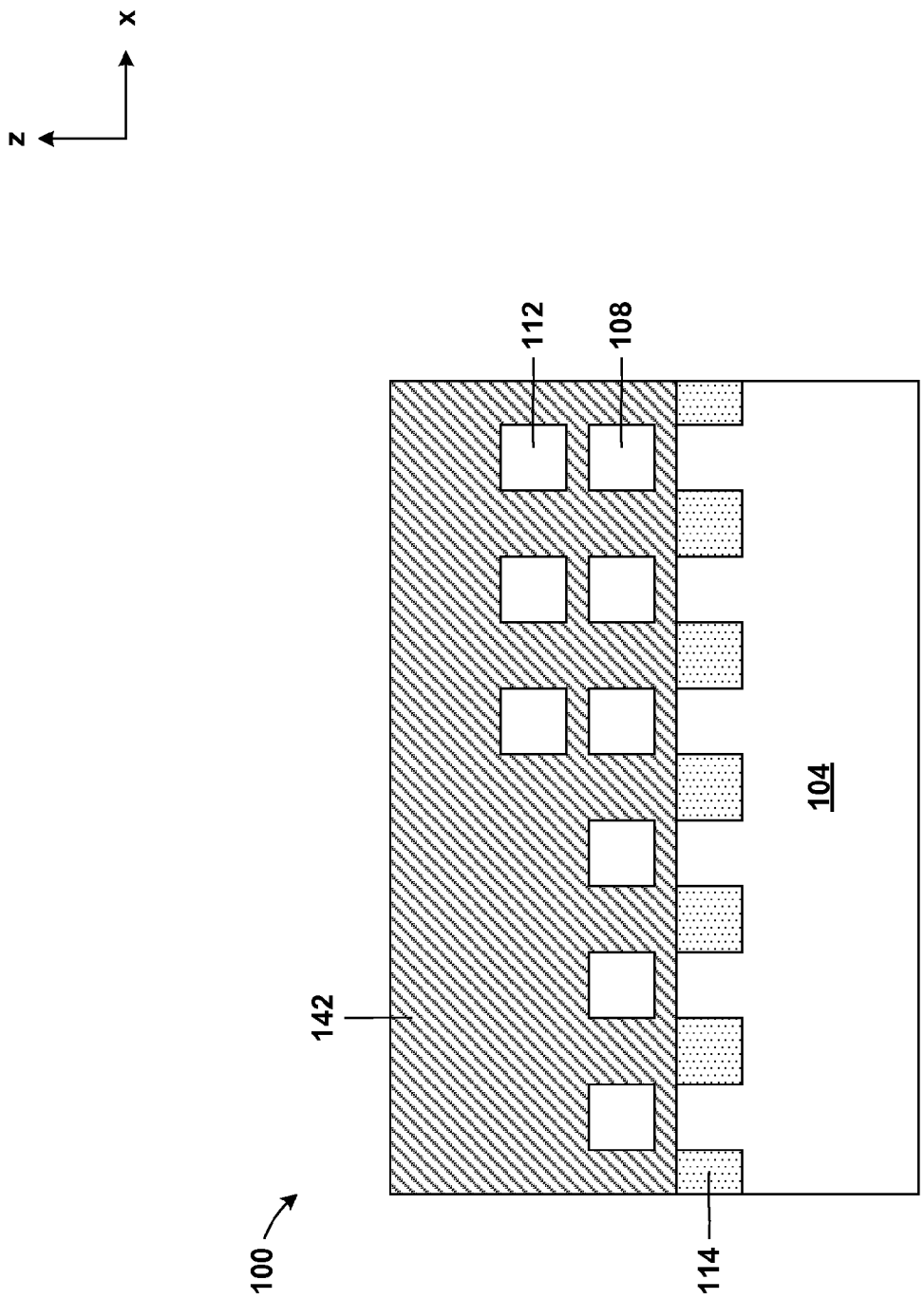
FIG. 43 is a cross section view of FIG. 41, taken along section line B-B.
Figure 44:
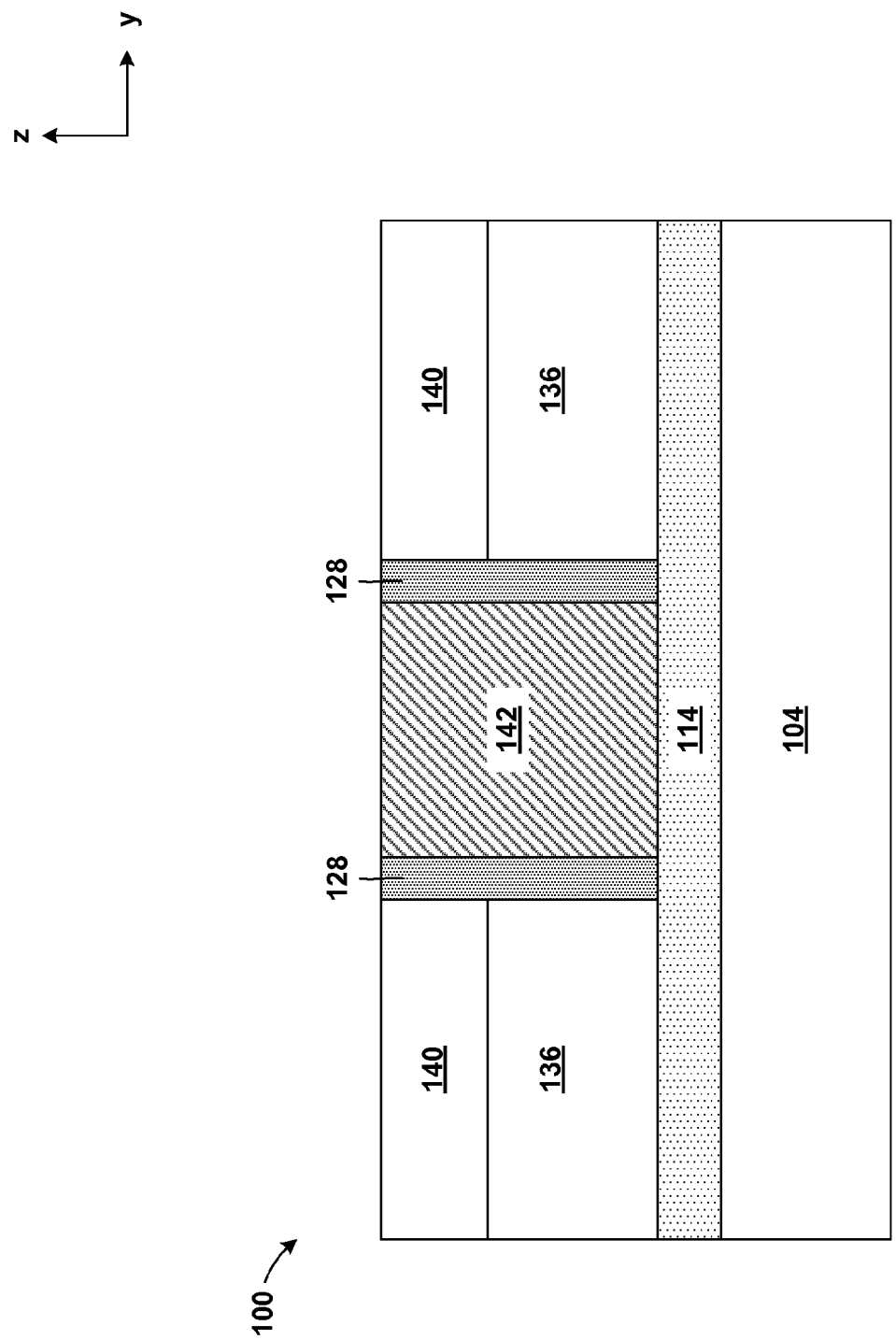
FIG. 44 is a cross section view of FIG. 41, taken along section line C-C.
Figure 45:
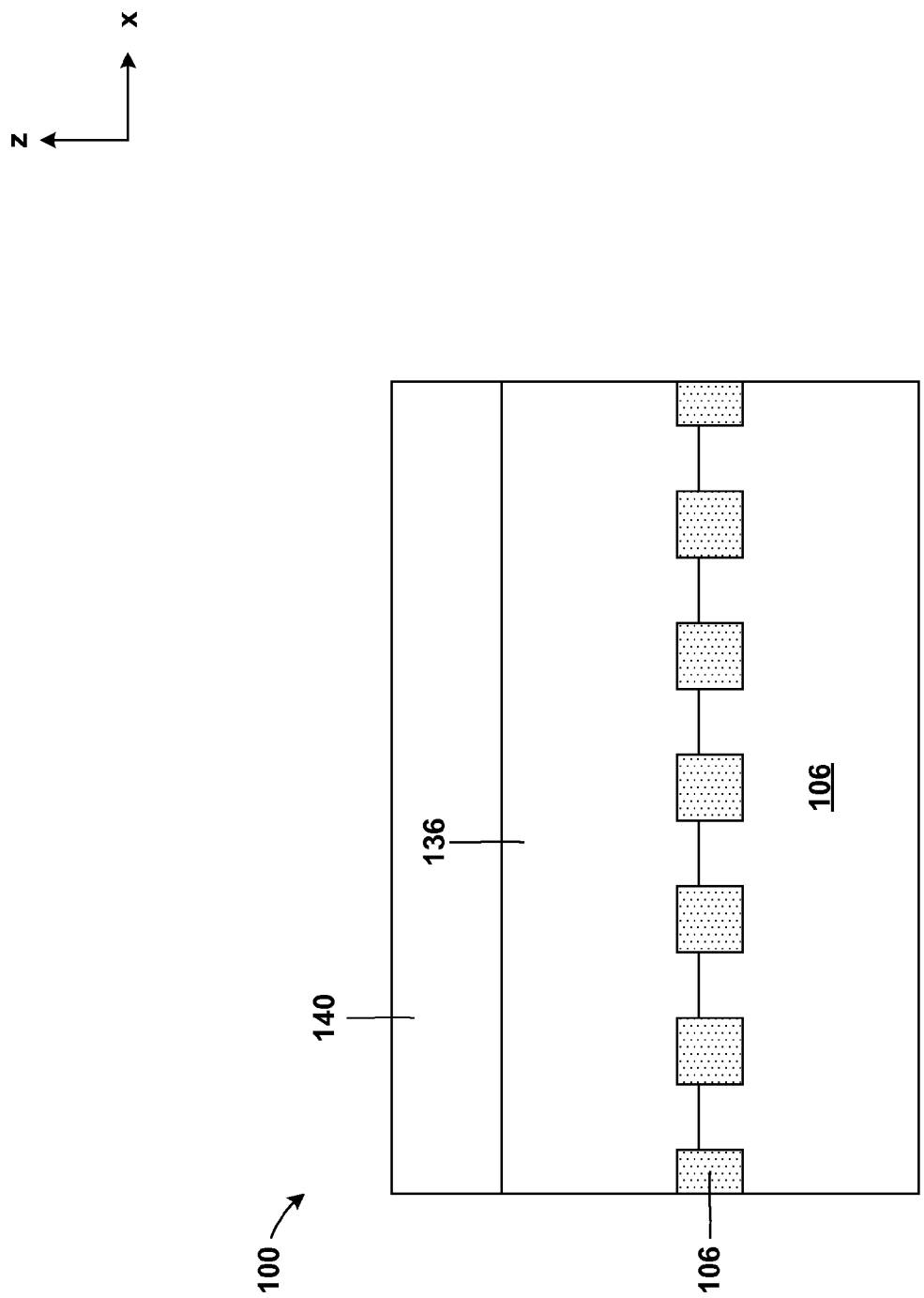
FIG. 45 is a cross section view of FIG. 41, taken along section line D-D.

FIGS. 41, 42, 43, 44, and 45 are a demonstrative illustration of the structure during an intermediate step of a method of fabricating a plurality of finFET devices having a variable number of nano-wires according to one embodiment. More specifically, the method can include forming a gate electrode 142 around the first and second nanowire channels 108, 112. FIG. 41 illustrates the structure 100 from a top view. FIG. 42 is a cross section view of FIG. 41 taken along section line A-A. FIG. 43 is a cross section view of FIG. 41 taken along section line B-B. FIG. 44 is a cross section view of FIG. 41 taken along section line C-C. FIG. 45 is a cross section view of FIG. 41 taken along section line D-D.

Typical replacement gate fabrication techniques well known in the art may be used to form the gate electrode 142 and complete the formation of the structure 100. In one embodiment, a gate oxide (not shown) may be deposited prior to forming the gate electrode 142. The gate oxide may include any of the high-k dielectric materials known in the art, for example $HfO_2$, and deposited with methods such as atomic layer deposition (ALD), chemical vapor deposition (CVD), or physical vapor deposition (PVD). The gate electrode 142 may include one or more work function metals such as TiN, TaN, or TiC, to achieve the desired device threshold voltage and one or more low resistance metal such as W, Al, or Co. The gate electrode 142 may substantially surround the first and second nanowire channels 108, 112 exposed after removing the dummy gate 126 in the previous step. More specifically, the gate electrode 142 may be formed between the substrate 104 and the first nanowire channel 108, and between the first nanowire channel 108 and the second nanowire channel 112. The structure 100 of the present embodiment may be referred to as a gate-all-around finFET structure because the gate electrode 142 completely surrounds each of the nanowire channels 108, 112.

The embodiments described above may reduce or eliminate design constraints and improve design flexibility of stacked nanowire devices with respect to their current carrying capacity. As previously described, the current carrying capacity of a single nanowire device may be defined and limited by the total number of nanowire channels. According to the above description engineers can design a single nanowire device with more flexibility in the current carrying capacities, than previously available. More specifically, the total number of nanowire channels in a single stacked nanowire device may be increased or decreased by a single nanowire channel regardless of the number of layers of nanowire channels or the number of nanowire channels per layer. Alternatively, the total number of nanowire channels in a stacked nanowire device may be increased or decreased by a single nanowire channel regardless of the number of nanowire stacks or the number of nanowire channels per stack. For example, the current carrying capacity of a single nanowire device having a total of twelve nanowire channels, two layers of six nanowire channels, may be increased or decreased by adding or subtracting a single nanowire channel. Furthermore, the techniques described above with reference to the fabrication of the stacked nanowire structure is fully compatible with current silicon-CMOS processing The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed:

1. A method of forming a semiconductor structure comprising:
    forming a stack of layers on a top surface of a substrate, the stack of layers consisting of alternating layers of a semiconductor material and a sacrificial semiconductor material, one on top of the other, wherein a bottommost layer of the stack of layers is a top semiconductor layer of the substrate;
    patterning a plurality of material stacks from the stack of layers, each material stack including an alternating stack of a plurality of nanowire channels and a plurality of sacrificial spacers, the plurality of nanowire channels comprising the semiconductor material, and the plurality of sacrificial spacers comprising the sacrificial semiconductor material;
    forming a shallow trench isolation region between the plurality of material stacks, wherein a topmost surface of the shallow trench isolation region is flush with, or located beneath, a topmost surface of the top semiconductor layer of the substrate; and
    removing at least one of the plurality of nanowire channels from at least one of the plurality of material stacks without removing one or more of the plurality of nanowire channels from an adjacent material stack.

2. The method of claim 1, wherein the semiconductor substrate is a semiconductor-on-insulator and the bottommost layer of the stack of layers is located on a buried insulating layer.

3. The method of claim 1, wherein forming the stack of layers on the top surface of the substrate comprises:
    epitaxially growing the alternating layers of the semiconductor material and the sacrificial semiconductor material, the epitaxial growth process is performed at a temperature of below 800° C. and at a pressure below 100 torr.

4. The method of claim 1, wherein removing the at least one of the plurality of nanowire channels from the at least one of the plurality of material stacks without removing one or more of the plurality of nanowire channels from the adjacent material stack comprises:
    protecting some of the plurality of material stacks with a mask;
    removing one or more of the topmost nanowire channels from the plurality of material stacks not protected by the mask; and
    removing one or more of the topmost sacrificial spacers from the plurality of material stacks not protected by the mask.

5. The method of claim 1, further comprising:
    forming a gate electrode over and all around a central portion of each of the plurality of nanowire channels.

6. The method of claim 1, further comprising:
forming a source region and a drain region each self-aligned to a gate electrode, the gate electrode formed over and all around a central portion of each of the plurality of nanowire channels.

7. A method of forming a semiconductor structure comprising:
forming a stack of layers on a top surface of a substrate, the stack of layers consisting of alternating layers of a semiconductor material and a sacrificial semiconductor material, one on top of the other, wherein a bottommost layer of the stack of layers is a top semiconductor layer of the substrate;
patterning a plurality of material stacks from the stack of layers, each material stack including an alternating stack of a plurality of nanowire channels and a plurality of sacrificial spacers, the plurality of nanowire channels comprising the semiconductor material, and the plurality of sacrificial spacers comprising the sacrificial semiconductor material;
forming a shallow trench isolation region between the plurality of material stacks, wherein a topmost surface of the shallow trench isolation region is flush with, or located beneath, a topmost surface of the top semiconductor layer of the substrate;
removing at least one of the plurality of nanowire channels from at least one of the plurality of material stacks without removing one of the plurality of nanowire channels from an adjacent material stack;
forming a dummy gate directly on a central portion of each of the plurality of material stacks;
forming a pair of sidewall spacers abutting opposite sides of the dummy gate;
removing a portion of the plurality of sacrificial spacers not covered by the dummy gate to create one or more openings between the plurality of nanowire channels;
depositing a dielectric material in the one or more openings between the plurality of nanowire channels;
forming a source region and a drain region each self-aligned to opposite sidewall spacers, the source region and the drain region being in direct contact with opposite end segments of the plurality of nanowire channels;
removing the dummy gate to form a trench over the central portion of the plurality of material stacks;
removing the plurality of sacrificial spacers exposed in the trench selective to the plurality of nanowire channels; and
forming a gate electrode within the trench and all around the plurality of nanowire channels.

8. The method of claim 7, wherein the semiconductor substrate is a semiconductor-on-insulator and the bottommost layer of the stack of layers is located on a buried insulating layer.

9. The method of claim 7, wherein forming the stack of layers on the top surface of the substrate comprises:
epitaxially growing the alternating layers of the semiconductor material and the sacrificial semiconductor material, the epitaxial growth process is performed at a temperature of below 800° C. and at a pressure below 100 torr.

10. The method of claim 7, wherein removing the portion of the plurality of sacrificial spacers not covered by the dummy gate to create the one or more openings between the plurality of nanowire channels comprises:
using an etchant that exploits the lower oxidation potential of the layers of sacrificial semiconductor material compared to the layers of semiconductor material.

11. The method of claim 7, wherein removing the portion of the plurality of sacrificial spacers not covered by the dummy gate to create the one or more openings between the plurality of nanowire channels comprises:
using a plasma etching process.

12. The method of claim 7, wherein removing the portion of the plurality of sacrificial spacers not covered by the dummy gate to create the one or more openings between the plurality of nanowire channels comprises:
using a wet or dry oxidation process performed at a temperature of less than 750° C.

13. The method of claim 7, wherein removing at least one of the plurality of nanowire channels from at least one of the plurality of material stacks without removing one of the plurality of nanowire channels from the adjacent material stack comprises:
protecting some of the plurality of material stacks with a mask;
removing one or more of the topmost nanowire channels from the plurality of material stacks not protected by the mask; and
removing one or more of the topmost sacrificial spacers from the plurality of material stacks not protected by the mask.

* * * * *